US011355348B2

(12) United States Patent
Lugani et al.

(10) Patent No.: US 11,355,348 B2
(45) Date of Patent: Jun. 7, 2022

(54) INTEGRATED CIRCUIT, CONSTRUCTION OF INTEGRATED CIRCUITRY, AND METHOD OF FORMING AN ARRAY

(71) Applicant: Micron Technology, Inc., Boise, ID (US)

(72) Inventors: Gurpreet Lugani, Boise, ID (US); Kyle B. Campbell, Boise, ID (US); Mario J. Di Cino, Boise, ID (US); Aaron W. Freese, Boise, ID (US); Alex Kogan, Boise, ID (US); Kevin R. Shea, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/847,902

(22) Filed: Apr. 14, 2020

(65) Prior Publication Data

US 2020/0266071 A1 Aug. 20, 2020

Related U.S. Application Data

(62) Division of application No. 16/043,869, filed on Jul. 24, 2018, now Pat. No. 10,692,727.

(51) Int. Cl.
*H01L 21/30* (2006.01)
*H01L 21/308* (2006.01)
(Continued)

(52) U.S. Cl.
CPC ........ *H01L 21/3081* (2013.01); *G11C 11/221* (2013.01); *H01L 21/0274* (2013.01);
(Continued)

(58) Field of Classification Search
CPC ............ H01L 21/3081; H01L 21/3088; H01L 21/0274; H01L 21/0337; H01L 21/3086;
(Continued)

(56) References Cited

U.S. PATENT DOCUMENTS 5,328,810 A 7/1994 Lowrey et al.
7,115,525 B2 10/2006 Abatchev et al.
(Continued)

FOREIGN PATENT DOCUMENTS

EP 19841247 11/2021
WO WO 7/2019
PCT/US2019/025509
WO WO 1/2021
PCT/US2019/025509

*Primary Examiner* — Matthew L Reames
(74) *Attorney, Agent, or Firm* — Wells St. John P.S.

(57) ABSTRACT

A method of forming an array comprising using two different composition masking materials in forming a pattern of spaced repeating first features of substantially same size and substantially same shape relative one another. A pattern-interrupting second feature of at least one of different size or different shape compared to that of the first features is within and interrupts the pattern of first features. The pattern of the first features with the pattern-interrupting second feature are translated into lower substrate material that is below the first features and the pattern-interrupting second feature. Material of the first features and of the pattern-interrupting second feature that is above the lower substrate material is removed at least one of during or after the translating. After the removing, the pattern-interrupting second feature in the lower substrate material is used as a reference location to reckon which of the two different composition masking materials was used to make first spaces between the first features in an analysis area in the material that was above the lower substrate material or which of the two different composition masking materials was used to make second spaces between the first features in the analysis area that alternate with the first spaces. Structure independent of method is disclosed.

9 Claims, 23 Drawing Sheets

(51) Int. Cl.

| | |
|---|---|
| *H01L 21/027* | (2006.01) |
| *H01L 21/033* | (2006.01) |
| *G11C 11/22* | (2006.01) |
| *H01L 21/311* | (2006.01) |
| *H01L 21/3213* | (2006.01) |

(52) U.S. Cl.
CPC ...... *H01L 21/0332* (2013.01); *H01L 21/0337* (2013.01); *H01L 21/0338* (2013.01); *H01L 21/3086* (2013.01); *H01L 21/3088* (2013.01); *H01L 21/31144* (2013.01); *H01L 21/32139* (2013.01)

(58) Field of Classification Search
CPC ........... H01L 21/0332; H01L 21/31144; H01L 21/32139; H01L 21/0338; G11C 11/221
See application file for complete search history.

(56) References Cited

U.S. PATENT DOCUMENTS

| | | |
|---|---|---|
| 9,105,699 B2 | 8/2015 | Farys |
| 2010/0155887 A1 | 6/2010 | Lindert et al. |
| 2011/0014786 A1 | 1/2011 | Sezginer et al. |
| 2014/0084451 A1 | 3/2014 | Ogisu et al. |
| 2014/0346677 A1 | 11/2014 | Sonoda |
| 2015/0325791 A1 | 11/2015 | Wells |
| 2016/0254171 A1 | 9/2016 | Shamma et al. |
| 2016/0293478 A1* | 10/2016 | Yuan ................. H01L 21/76802 |

\* cited by examiner

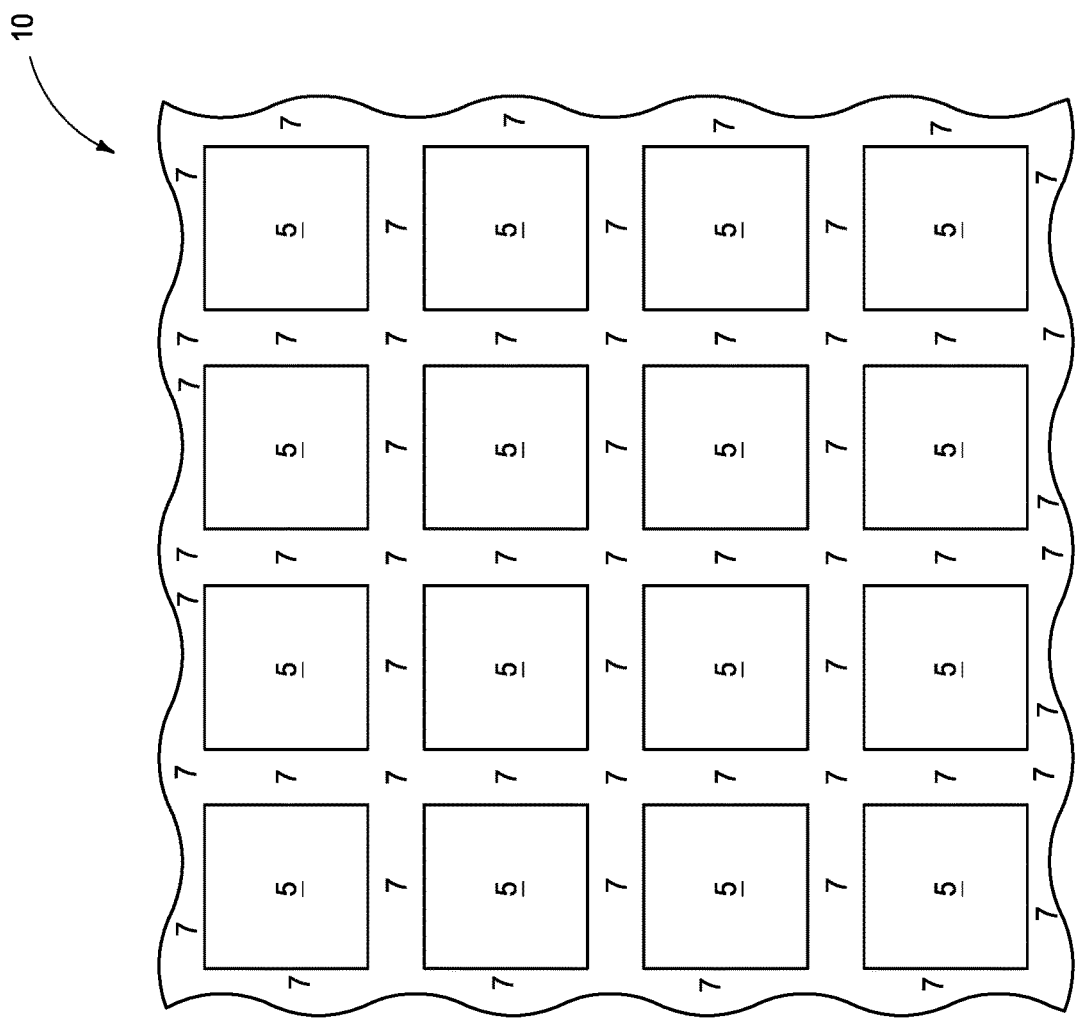

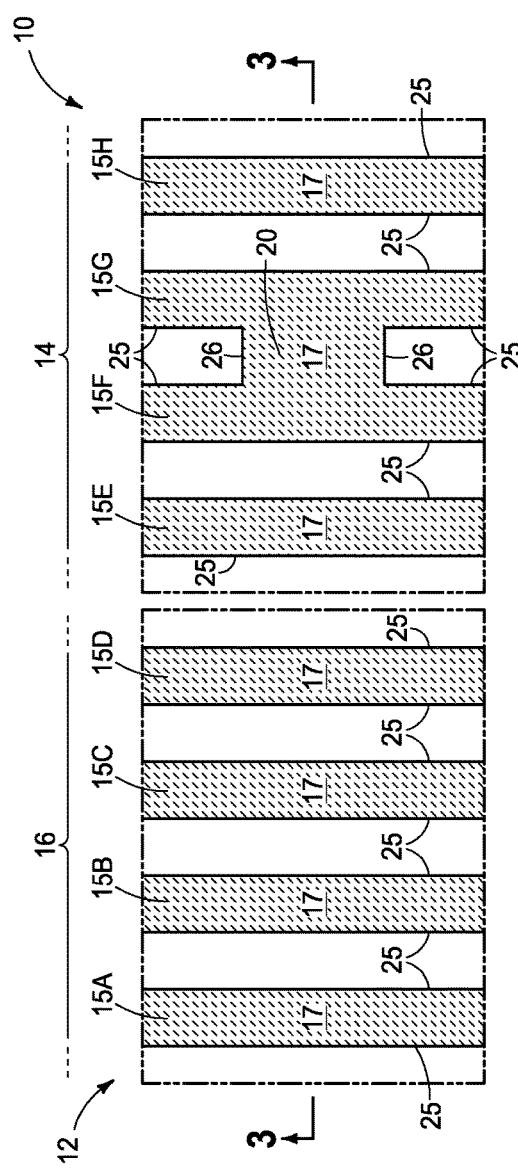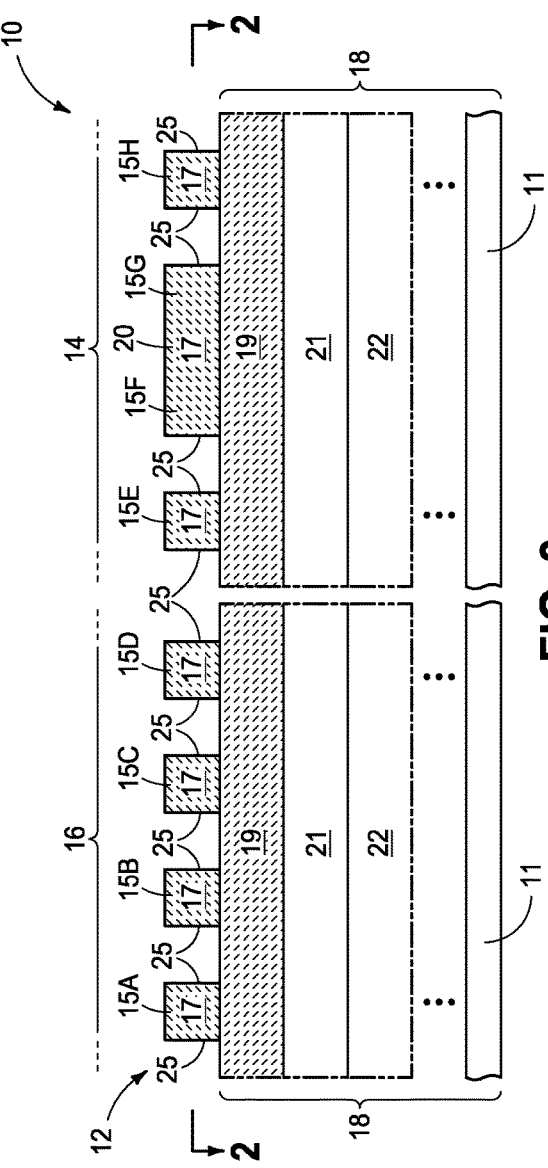

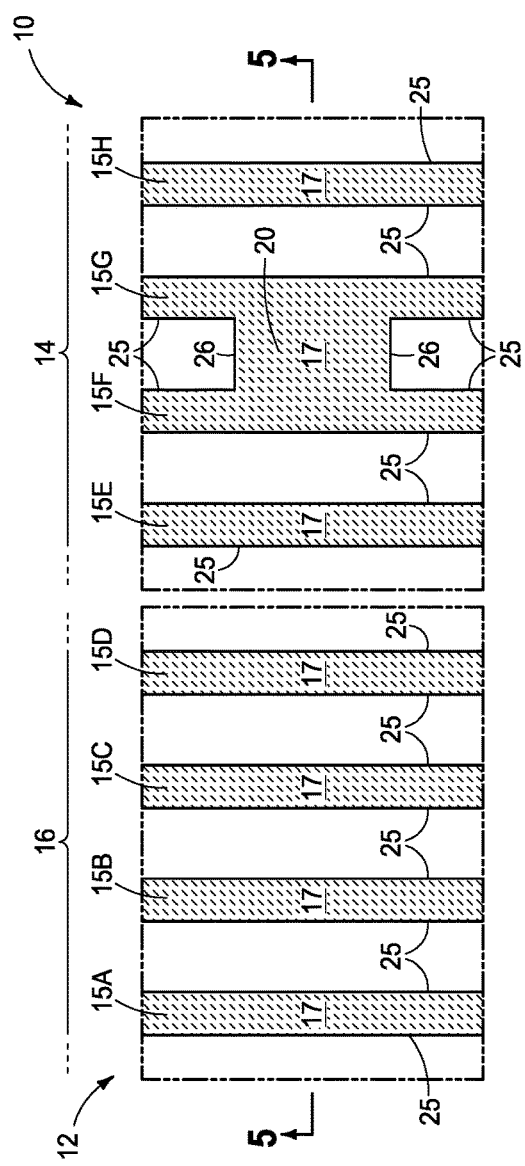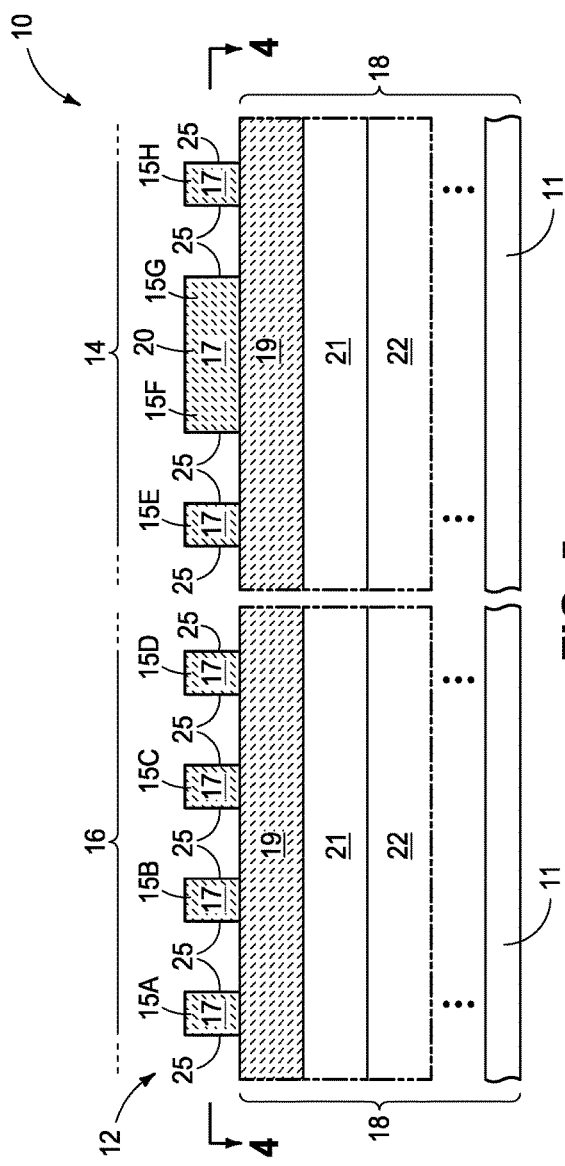

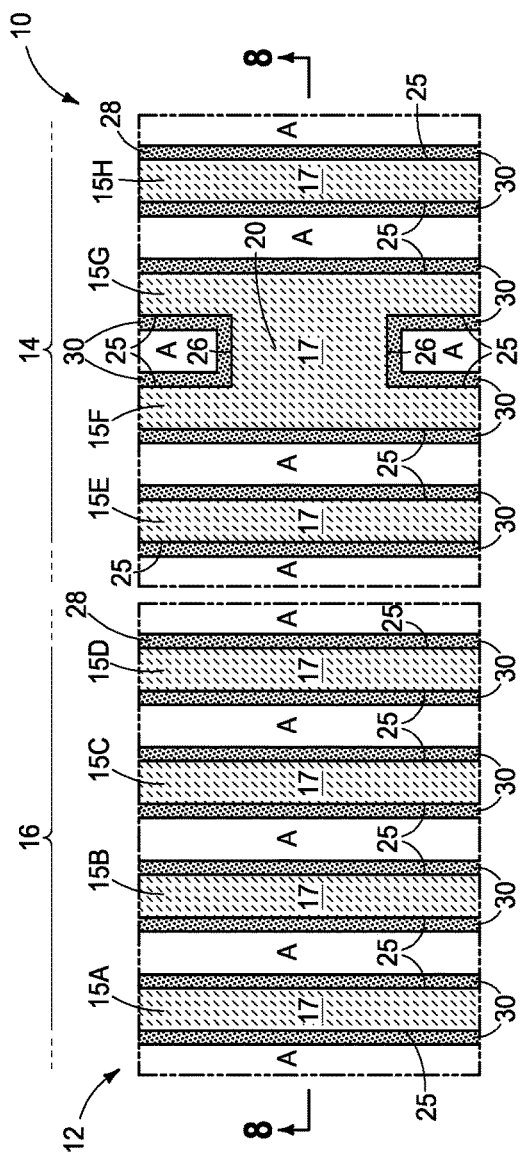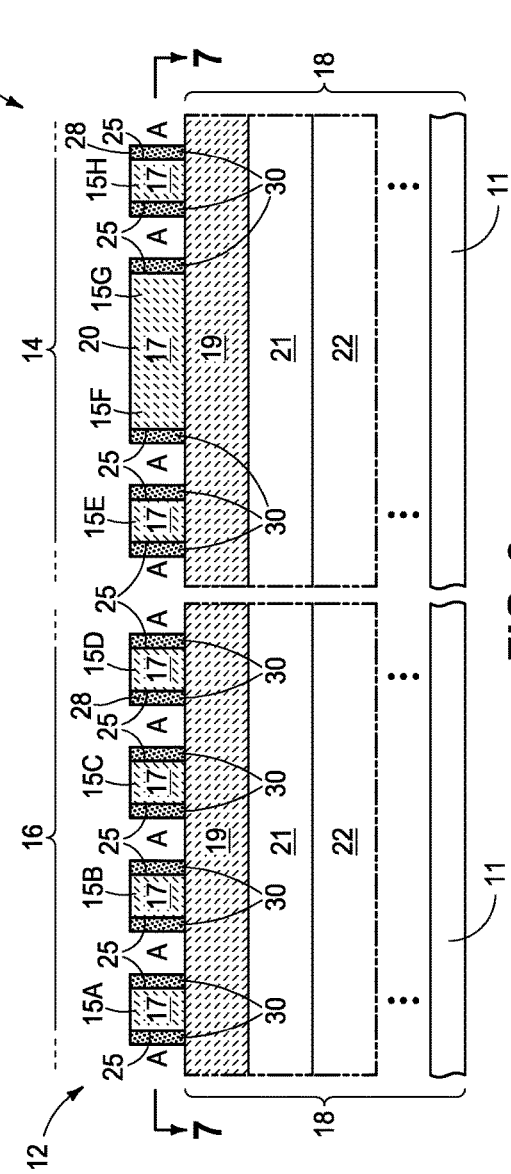

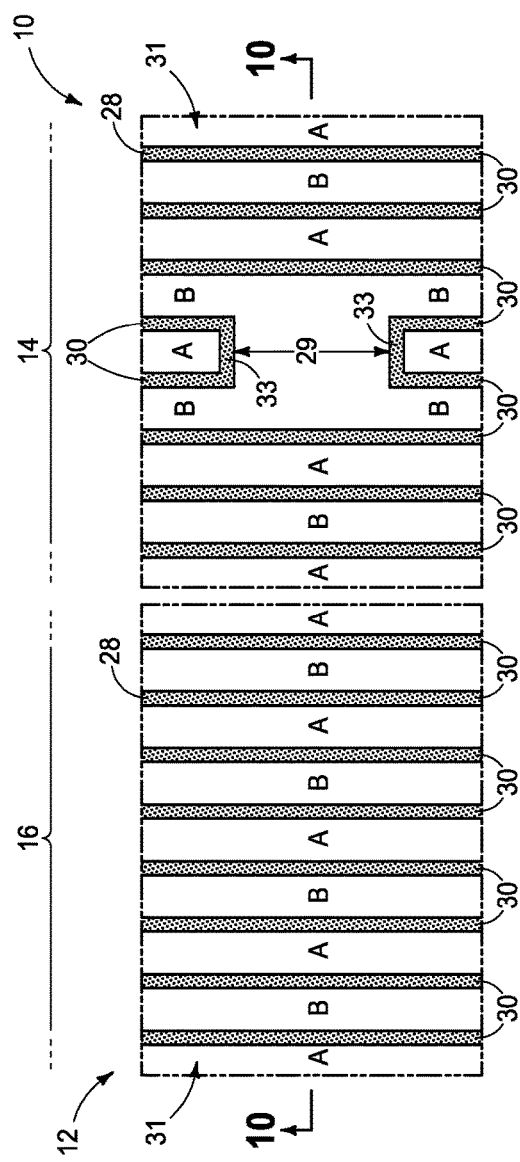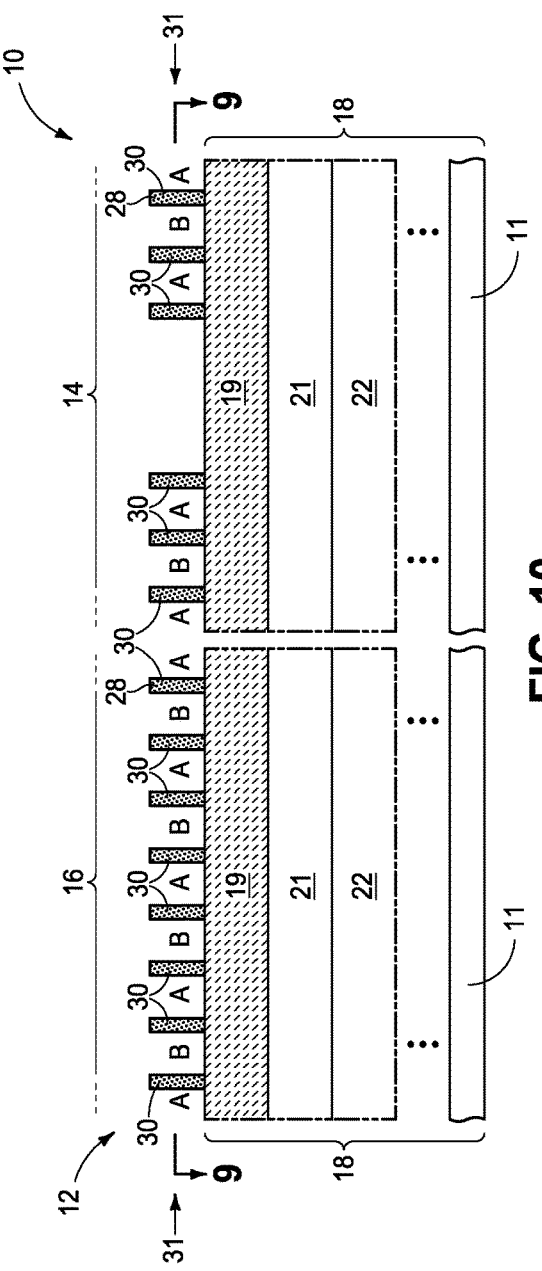
FIG. 9
FIG. 10

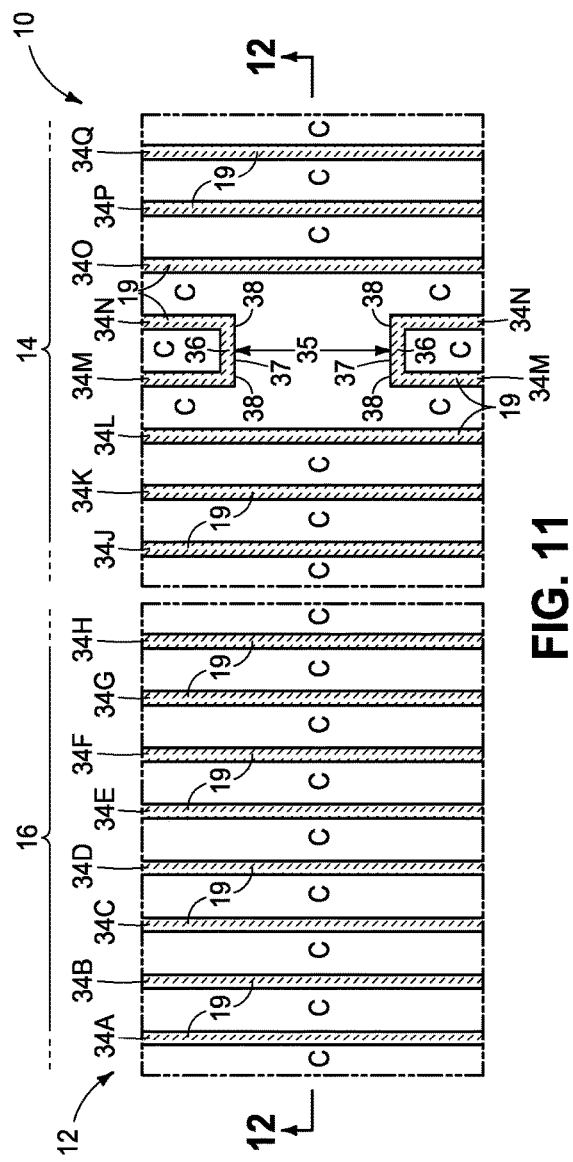
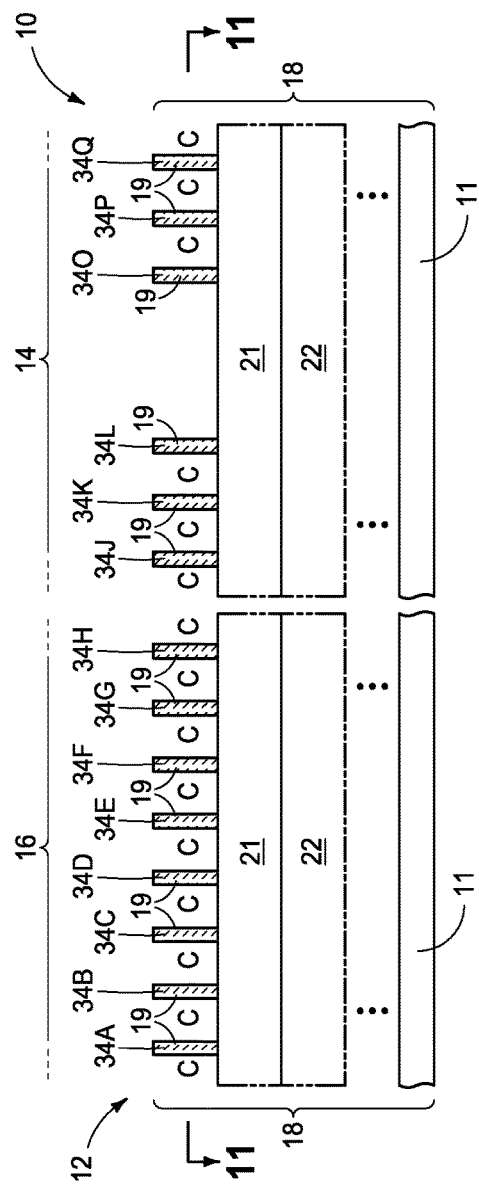
FIG. 11
FIG. 12

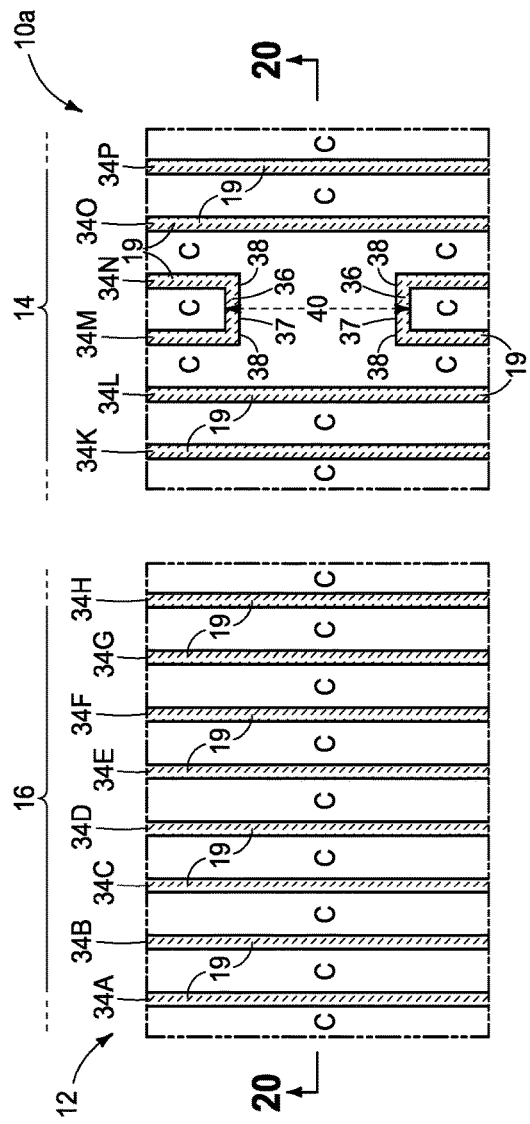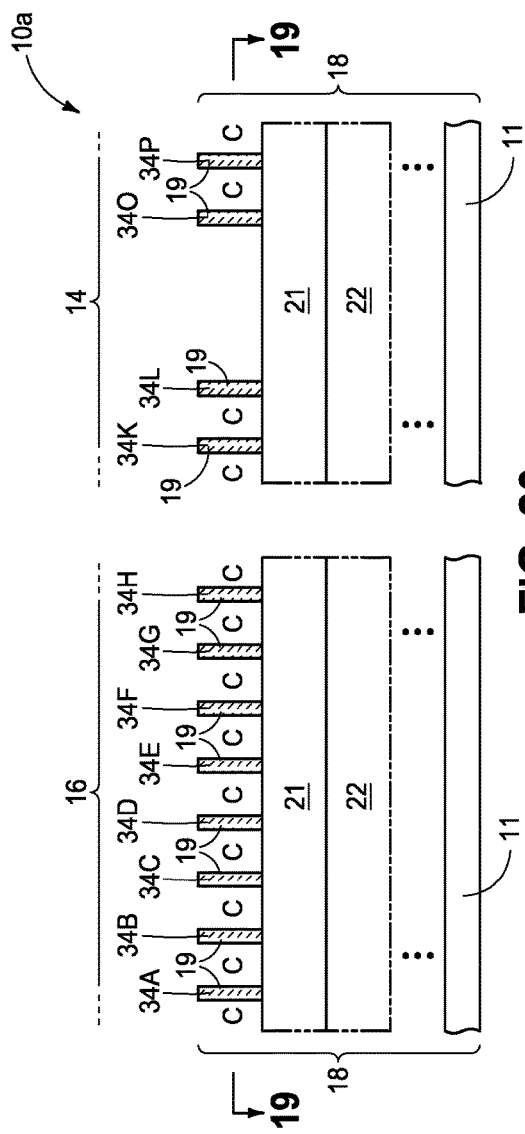

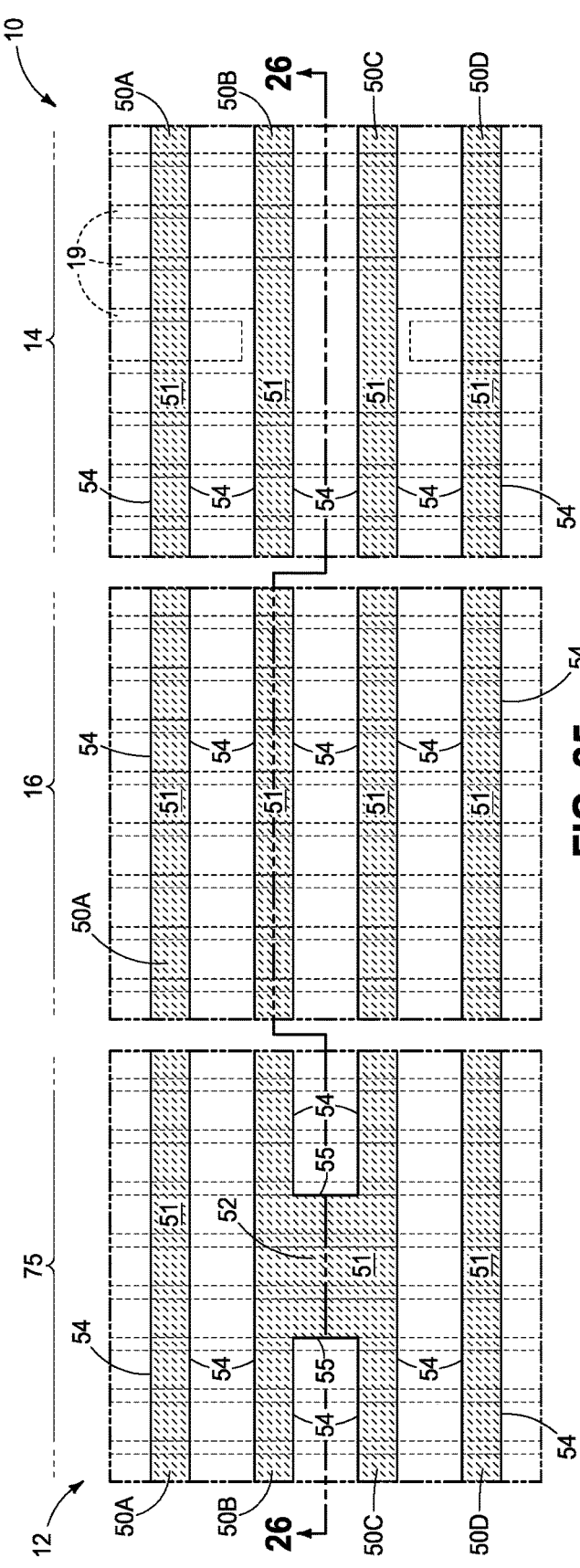
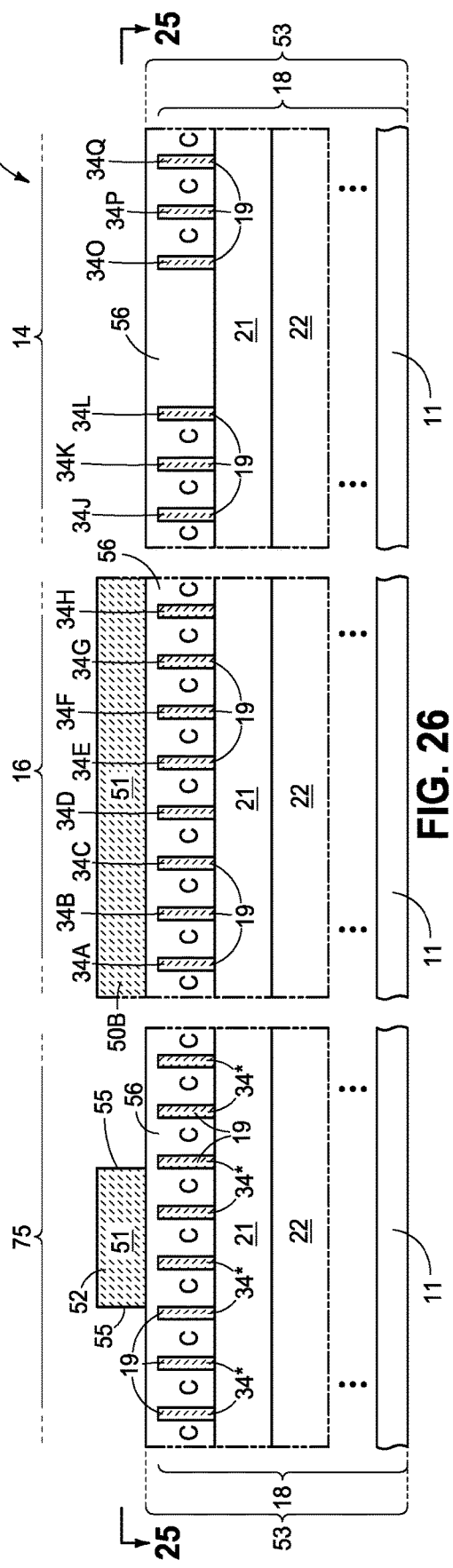
FIG. 25
FIG. 26

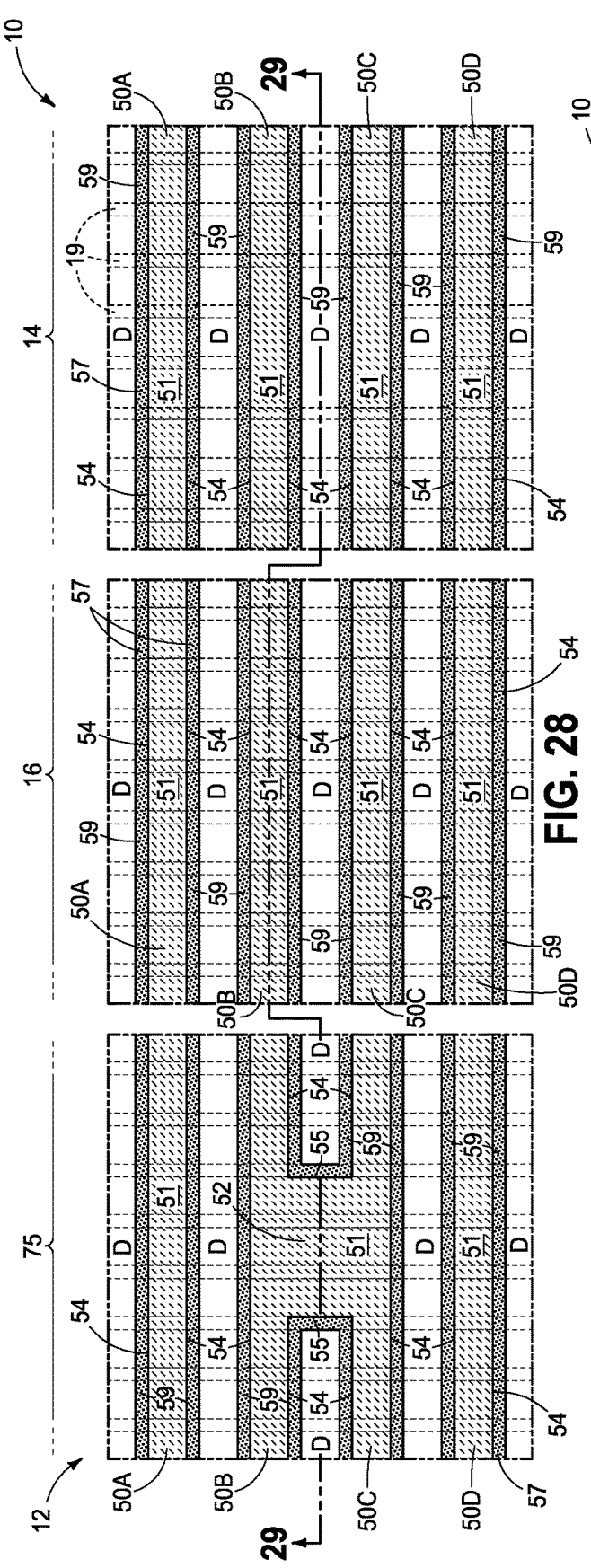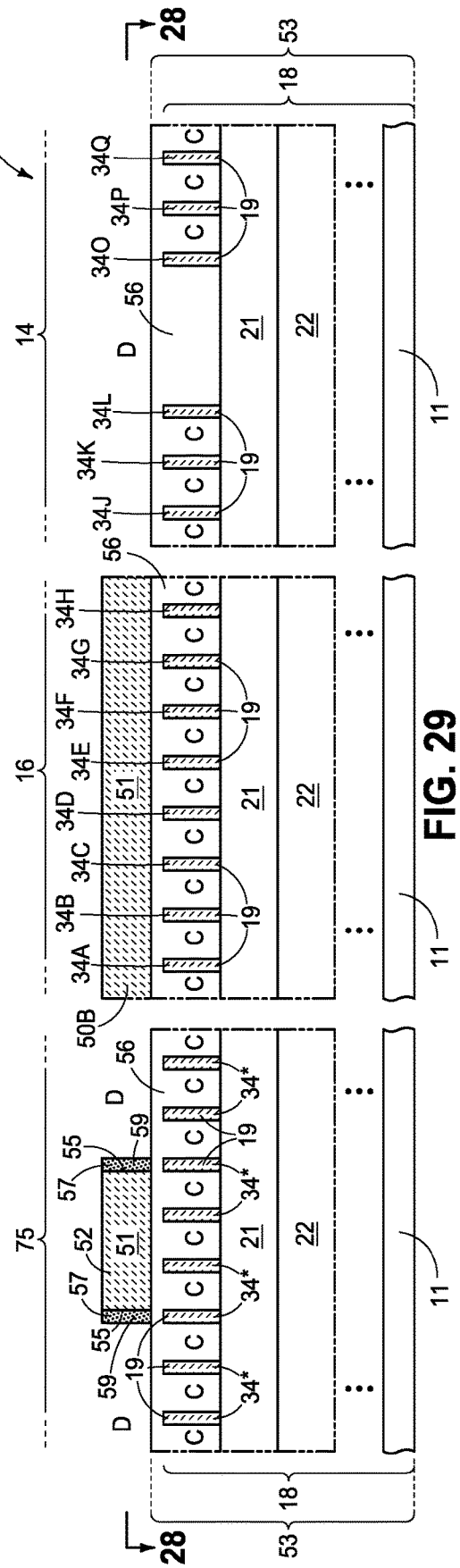

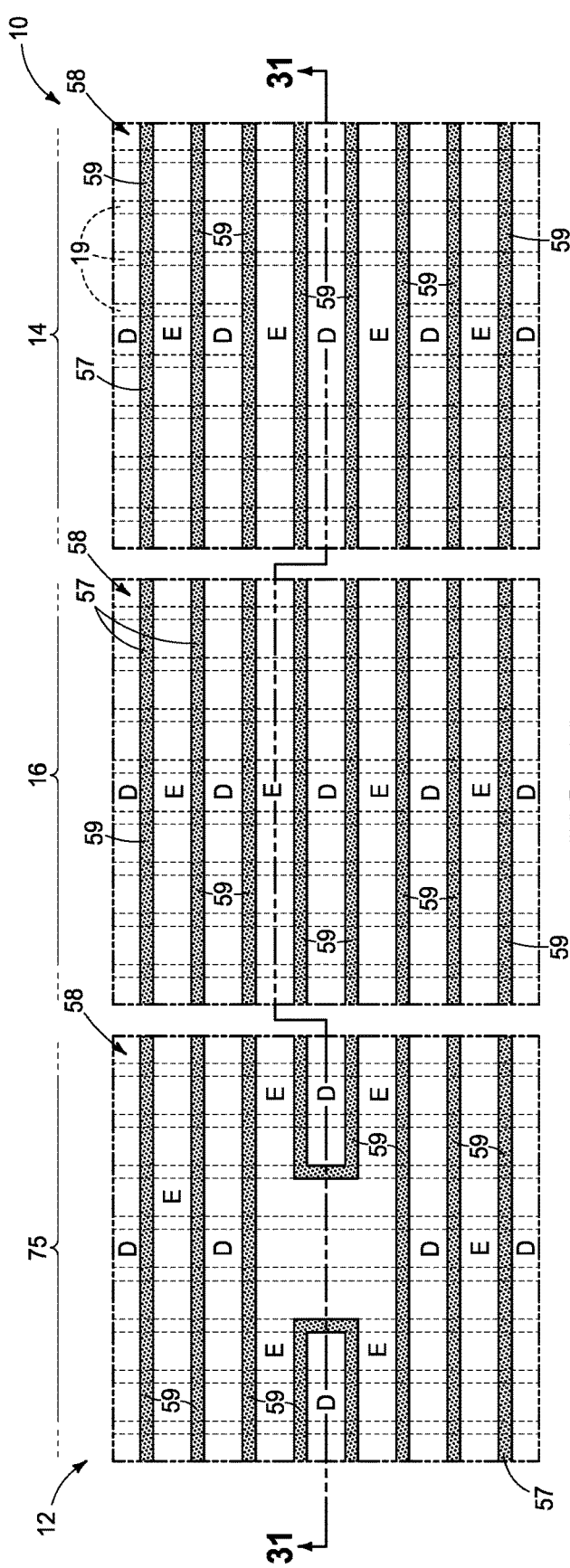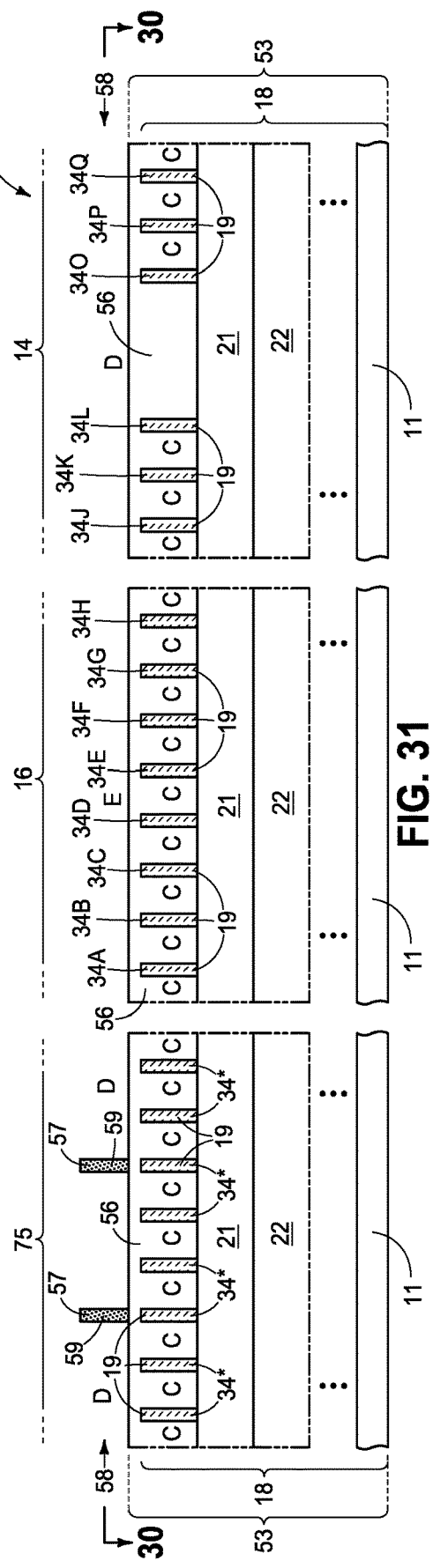
FIG. 30
FIG. 31

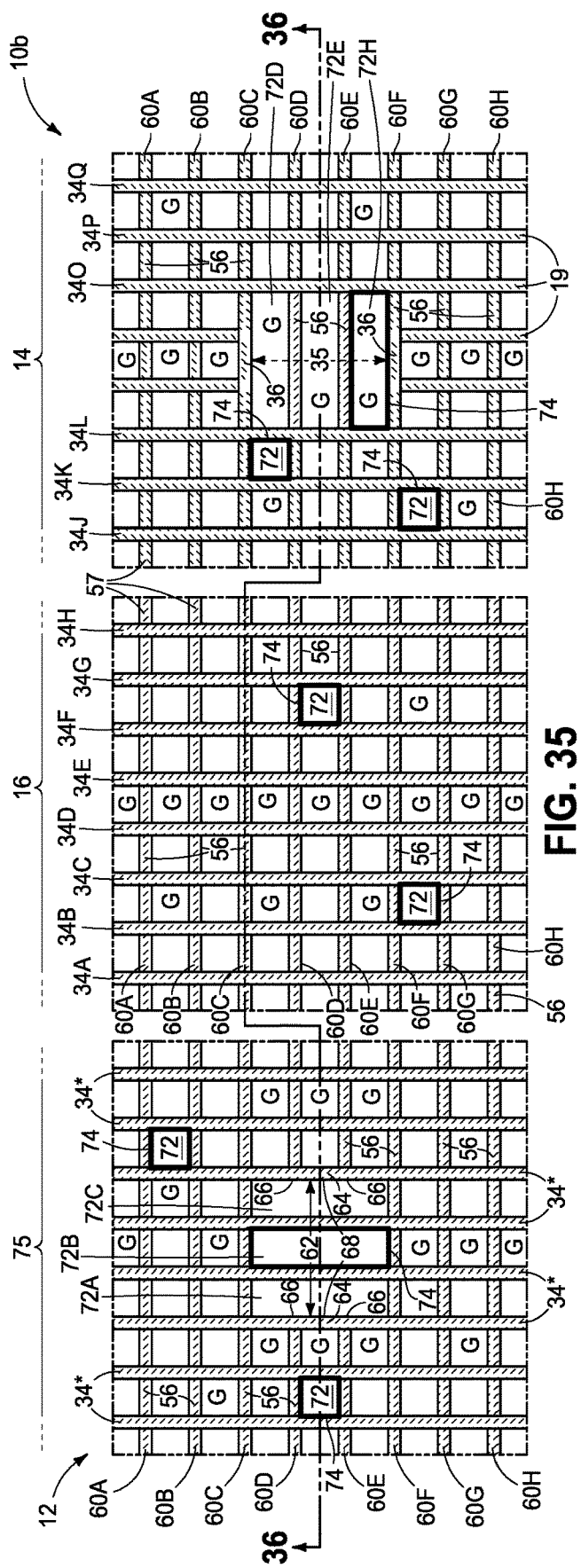
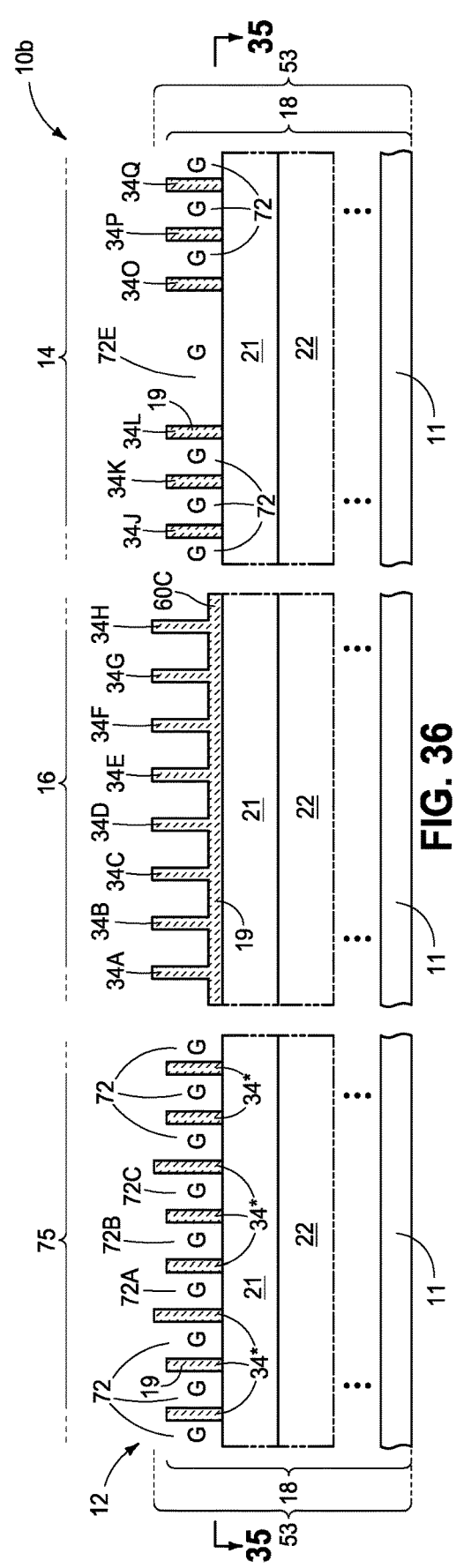
FIG. 35
FIG. 36

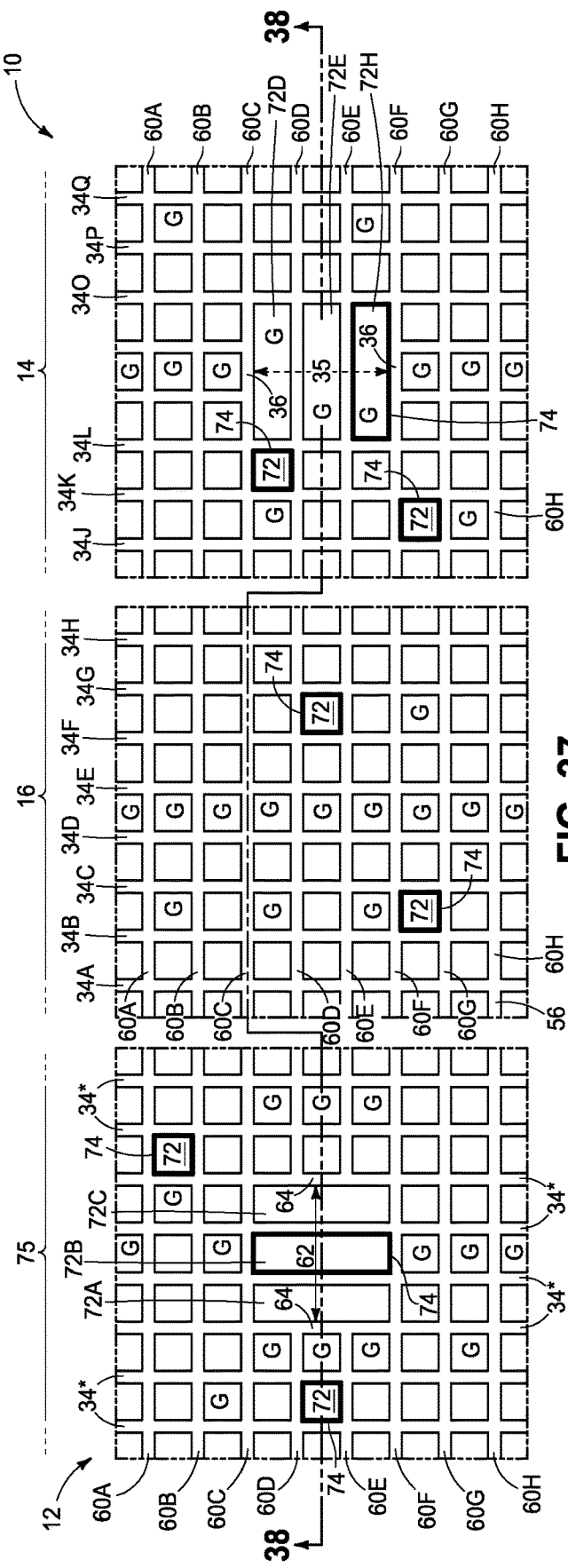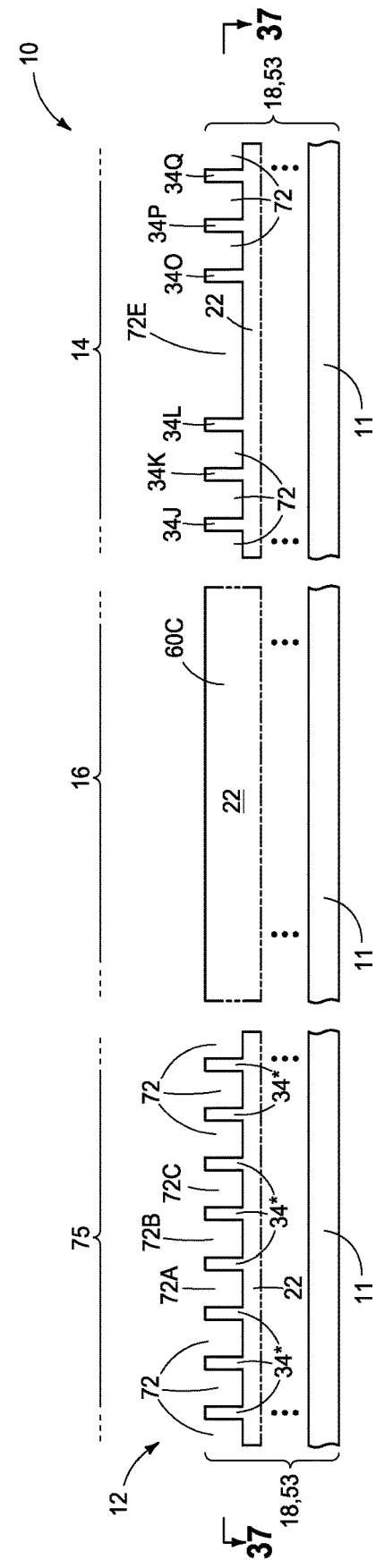
FIG. 37
FIG. 38

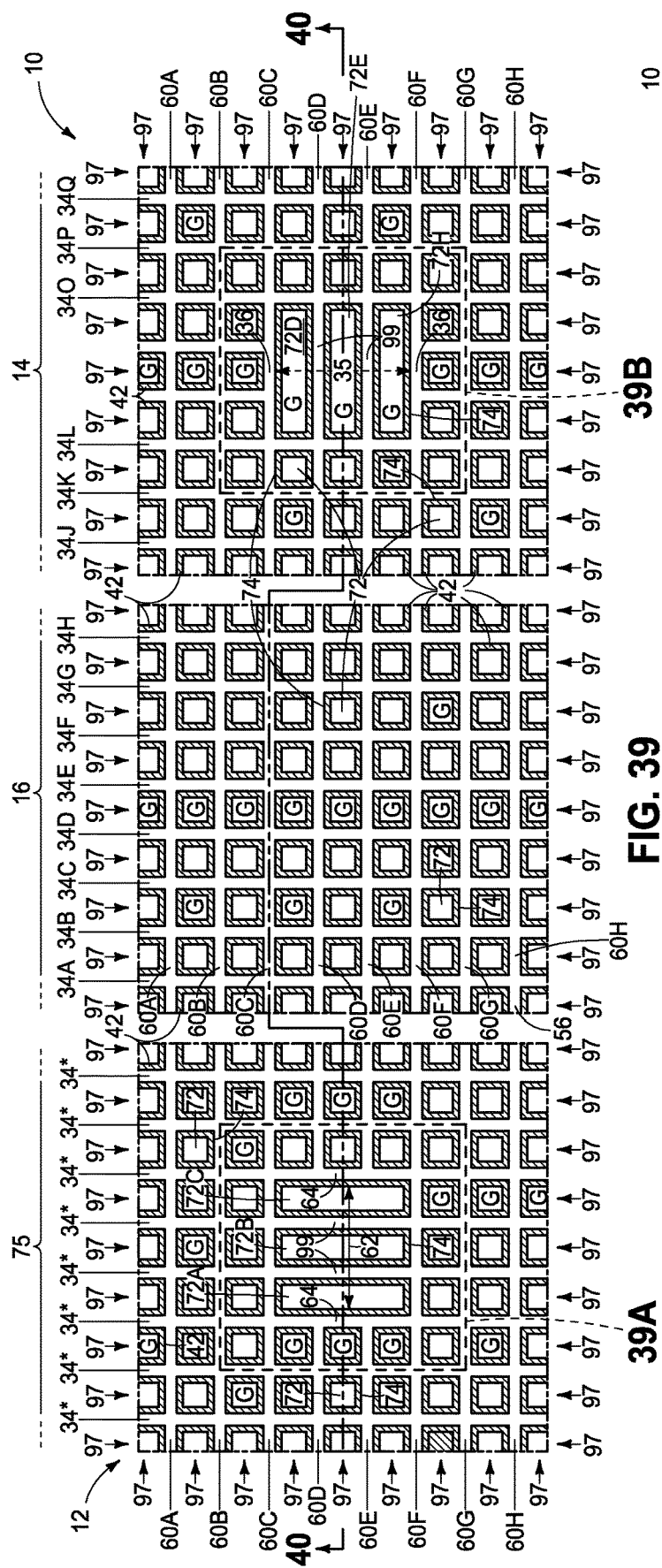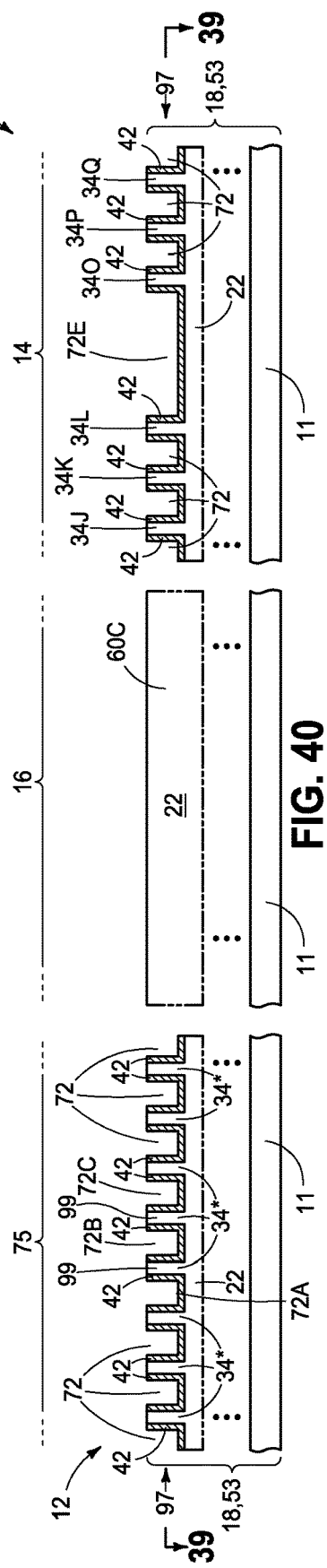
FIG. 39
FIG. 40

INTEGRATED CIRCUIT, CONSTRUCTION OF INTEGRATED CIRCUITRY, AND METHOD OF FORMING AN ARRAY

RELATED PATENT DATA

This patent resulted from a divisional of U.S. patent application Ser. No. 16/043,869 which was filed Jul. 24, 2018 and which is hereby incorporated by reference herein.

TECHNICAL FIELD

Embodiments disclosed herein pertain to integrated circuits, to constructions of integrated circuitry, and to methods of forming an array.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The digitlines may conductively interconnect memory cells along columns of the array, and the access lines may conductively interconnect memory cells along rows of the array. Each memory cell may be uniquely addressed through the combination of a digitline and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1. In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. Other programmable materials may be used as a capacitor insulator to render capacitors non-volatile.

The continual reduction in feature size places ever greater demands on the techniques used to form those features. One well-known technique is photolithography that is commonly used to pattern features, such as conductive lines or capacitor electrodes, on a substrate. The concept of pitch can be used to describe the size of these features. For a repeating pattern typical of memory or other arrays, pitch is defined as the distance between an identical point in two neighboring features. Adjacent features are typically separated by a material, such as an insulator. As a result, pitch can be viewed as the sum of the width of the feature and of the width of the space or material separating that feature from an immediately-neighboring feature. Due to optical factors, such as lens limitations and light or radiation wavelength, photolithographic techniques have minimum pitches below which a particular photolithographic technique cannot reliably form features. This minimum pitch is commonly referred to by a variable defining one half of the minimum pitch, or feature size F. This variable is often referred to as a "resolution." The minimum pitch, 2F, places a theoretical limit on feature size reduction.

Pitch multiplication (e.g. pitch doubling being one form thereof) is one method for extending the capabilities of photolithographic techniques beyond their minimum pitch, achieving a pitch of less than 2F. Two pitch doubling techniques are illustrated and described in U.S. Pat. No. 5,328,810 to Lowrey et al. and in U.S. Pat. No. 7,115,525 to Abatchev, the disclosures of which are incorporated herein by reference in their entirety. Such techniques can successfully reduce the potential photolithographic pitch. Pitch multiplication can occur by other or greater than by "doubling", including by non-integer values.

The invention was motivated in addressing issues associated with or arising out of pitch multiplication and photolithography, although it is not so limited.

BRIEF DESCRIPTION OF THE DRAWINGS

FIG. 1 is a diagrammatic top plan view of a portion of a substrate in process in accordance with one or more embodiments of the invention and of a portion of a substrate in accordance with one or more embodiments of the Invention.

FIG. 2 is a diagrammatic cross-sectional view of a portion of a substrate in process in accordance with an embodiment of the invention and is taken through line 2-2 in FIG. 3.

FIG. 3 is a view taken through line 3-3 in FIG. 2.

FIG. 4 is a view of the FIG. 2 substrate at a processing step subsequent to that shown by FIG. 2 and is taken through line 4-4 in FIG. 5.

FIG. 5 is a view taken through line 5-5 in FIG. 4.

FIG. 7 is a view of the FIG. 6 substrate at a processing step subsequent to that shown by FIG. 6 and is taken through line 7-7 in FIG. 8.

FIG. 8 is a view taken through line 8-8 in FIG. 7.

FIG. 9 is a view of the FIG. 7 substrate at a processing step subsequent to that shown by FIG. 7 and is taken through line 9-9 in FIG. 10.

FIG. 10 is a view taken through line 10-10 in FIG. 9.

FIG. 11 is a view of the FIG. 9 substrate at a processing step subsequent to that shown by FIG. 9 and is taken through line 11-11 in FIG. 12.

FIG. 12 is a view taken through line 12-12 in FIG. 11.

FIG. 19 is a view of the FIG. 17 substrate at a processing step subsequent to that shown by FIG. 17 and is taken through line 19-19 in FIG. 20.

FIG. 20 is a view taken through line 20-20 in FIG. 19.

FIG. 25 is a view of the FIG. 11 substrate at a processing step subsequent to that shown by FIG. 11 and is taken through line 25-25 in FIG. 26.

FIG. 26 is a view taken through line 26-26 in FIG. 25.

FIG. 28 is a view of the FIG. 27 substrate at a processing step subsequent to that shown by FIG. 27 and is taken through line 28-28 in FIG. 29.

FIG. 29 is a view taken through line 29-29 in FIG. 28.

FIG. 30 is a view of the FIG. 28 substrate at a processing step subsequent to that shown by FIG. 28 and is taken through line 30-30 in FIG. 31.

FIG. 31 is a view taken through line 31-31 in FIG. 30.

FIG. 35 is a view of the FIG. 34 substrate at a processing step subsequent to that shown by FIG. 34 and is taken through line 35-35 in FIG. 36.

FIG. 36 is a view taken through line 36-36 in FIG. 35.

FIG. 37 is a view of the FIG. 32 substrate at a processing step subsequent to that shown by FIG. 32 and is taken through line 37-37 in FIG. 38.

FIG. 38 is a view taken through line 38-38 in FIG. 37.

FIG. 39 is a view of the FIG. 37 substrate at a processing step subsequent to that shown by FIG. 37 and is taken through line 39-39 in FIG. 40.

FIG. 40 is a view taken through line 40-40 in FIG. 39.

DETAILED DESCRIPTION OF EXAMPLE EMBODIMENTS

Figure 6:
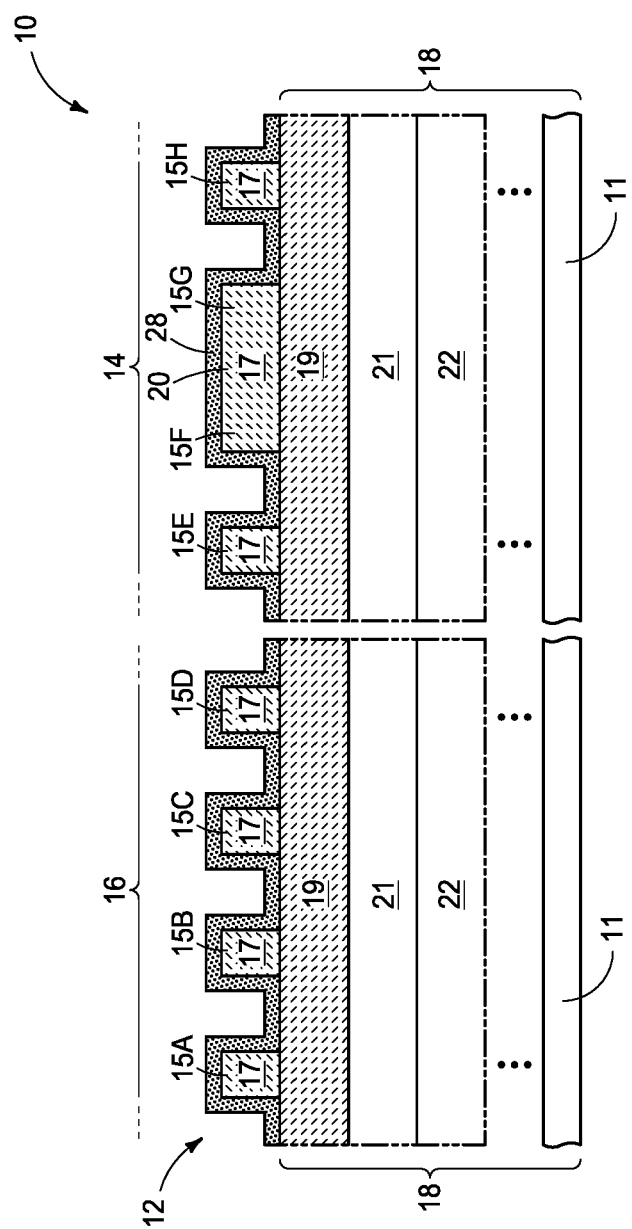
FIG. 6 is a view of the FIG. 5 substrate at a processing step subsequent to that shown by FIG. 5.

Example embodiments in accordance with the invention are described with reference to FIGS. 1-40. FIG. 1 shows a portion of a substrate construction 10 which may, for example, be a portion of a much larger substrate (e.g., a semiconductor wafer). Embodiments of the invention are initially described in a method of forming an array which may be formed on substrate 10 which in one example as shown in FIG. 1 comprises a plurality of integrated circuit die areas 5 (e.g., the integrated circuit chips in-process of fabrication) separated by scribe-line area 7.

FIGS. 2 and 3 show substrate construction 10 in process of an example method embodiment in accordance with the invention which comprises a base substrate 11 having any one or more of conductive/conductor/conducting (i.e., electrically herein), semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 2 and 3—depicted materials. For example, other partially or wholly fabricated components of integrated circuitry may be provided somewhere above, about, or within base substrate 11. Control and/or other peripheral circuitry for operating components within an array (e.g., array 12) may also be fabricated and may or may not be wholly or partially within an array or sub-array. Further, multiple sub-arrays may also be fabricated and operated independently, in tandem, or otherwise relative one another. In this document, a "sub-array" may also be considered as an array. Array 12 may be only a small portion of individual die areas 5.

Array 12 is shown as comprising a reference area 14 and an analysis area 16 that is laterally away from reference area 14. In one embodiment, reference area 14 may be within scribe-line area 7 and in another embodiment may be within a die area 5. Substrate construction 10 may include multiple reference areas 14 and/or multiple analysis areas 16. In one embodiment, analysis area 16 may be within scribe-line area 7 and in another embodiment may be within a die area 5. Analysis area 16 and reference area 14 may be in the same or different die area(s) 5 when each are in die area 5. Analogously, analysis area 16 and reference area 14 may be in the same or different scribe-line area(s) 7 between immediately-adjacent die areas 5 when each are in scribe-line area 7.

Longitudinally-elongated and laterally-spaced parallel mask lines 15A-15H (generically referred to as 15*) comprising photoimageable material 17 (e.g., a material capable of being photopatterned such as photoresist, polyimide, or future-developed photoimageable material) have been formed over a lower substrate material 18. For purposes of illustration and drawing clarity, only eight mask lines 15A-15H are shown. However, at least individual die areas 5 are likely to have hundreds of thousands, millions, etc. of such mask lines 15* therein. Hundreds of thousands, millions, etc. of such mask lines may also be within scribe-line area(s) 7, for example when a reference area 14 is within scribe-line area(s) 7. Mask lines 15* may be formed, by way of example, by photolithographic patterning and etch of photoimageable material 17 and which may be patterned at a lowest-capable resolution of such patterning at the time of fabrication. Individual mask lines 15* may be considered as having opposing sidewalls 25. Lower substrate material 18 may comprise a plurality of same or different composition materials (three layers 19, 21, and 22 being shown) that may comprise outer hardmasking layers, antireflective coatings, etc., and some of which may be sacrificial or some of which may remain at least in part in a finished construction (e.g., at least before dicing by cutting through scribe-line areas 7 to singulate die areas 5 into individual integrated-circuit die).

In some embodiments, mask lines 15* comprise (a): a mask bridge comprising the photoimageable material extending laterally between and interconnecting two immediately-laterally-adjacent of the mask lines, or (b): a longitudinal mask gap extending completely laterally across one of the mask lines. FIGS. 2 and 3 show an example embodiment comprising (a), specifically having a mask bridge 20 comprising photoimageable material 17 that extends laterally between and interconnects two immediately-laterally-adjacent mask lines 15F and 15G within reference area 14. Mask bridge 20 may be considered as having opposing sidewalls 26.

Referring to FIGS. 4 and 5, and in one embodiment, photoimageable material 17 has been laterally trimmed, thereby laterally trimming mask lines 15A-15H and mask bridge 20. Such may occur, for example, by isotropic etching which will also likely reduce vertical thickness (not shown) of photoimageable material 17.

Referring to FIG. 6, a material 28 of different composition from that of photoimageable material 17 (e.g., an oxide such as silicon dioxide) has been formed as shown. Such may be considered as a spacer layer or spacer-forming layer, for example as used in what some may consider as pitch multiplication processing.

FIGS. 7 and 8 show example subsequent processing wherein material 28 has been patterned (e.g., by maskless anisotropic etching thereof material 28) to largely remove such from being over horizontal surfaces, thereby forming sidewall masses 30 of different composition from photoimageable material 17 along opposing sidewalls 25 of individual mask lines 15* and along opposing sidewalls 26 of mask bridge 20. Immediately-adjacent sidewall masses 30 that are laterally between immediately-adjacent individual mask lines 15* may be considered as having first spaces A there-between. Spaces A may not necessarily be of the same size relative one another.

Referring to FIGS. 9 and 10, mask lines 15* (not shown) have been removed (e.g., by selective etching and/or ashing of photoimageable material 17 [not shown]) from between sidewall masses 30 to form second spaces B between sidewall masses 30 that laterally alternate with first spaces A. Use of "first" and "second" as respects spaces A and B is for convenience in distinguishing one from the other, and either may be formed before or while forming the other. Second spaces B may not necessarily be of the same size relative one another. Mask bridge 20 (not shown) has also been removed. Remaining sidewall masses 30 may be considered as collectively comprising a mask 31.

Referring to FIGS. 11 and 12, mask 31 (not shown) comprising sidewall masses 30 (not shown) has been used as a mask while etching into lower substrate material 18 there-below to form longitudinally-elongated and parallel target lines 34A-34Q (generically referred to as 34*) having third spaces C laterally there-between. Such may occur, for example, by etching material 19 (e.g., a sacrificial hard-masking material) selectively relative to material of sidewall masses 30 (not shown). Mask 31 (not shown) has been removed during and/or after such etching. Regardless, such has resulted in two immediately-laterally-adjacent of the target lines (e.g., 34M and 34N) having a longitudinal target gap 35 extending completely laterally across completely laterally between said immediately-laterally-adjacent target lines 34M and 34N at least in part as a result of mask bridge 20 as shown in FIGS. 7 and 8. Further, a lower-substrate-material bridge 36 (FIG. 11) extends laterally between and interconnects longitudinal ends 38 of said two immediately-laterally-adjacent target lines 34M and 34N at opposite longitudinal ends 37 of longitudinal target gap 35. Thus, in one embodiment, analysis area 16 is laterally away from longitudinal target gap 35 and lower-substrate-material bridges 36. In one embodiment where the analysis area, the longitudinal target gap, and the lower-substrate-material bridges are each in die area 5, such are in the same die area. In another embodiment where the analysis area, the longitudinal target gap, and the lower-substrate-material bridges are each in die area 5, such are in two different ones of the die areas.

Figure 13:
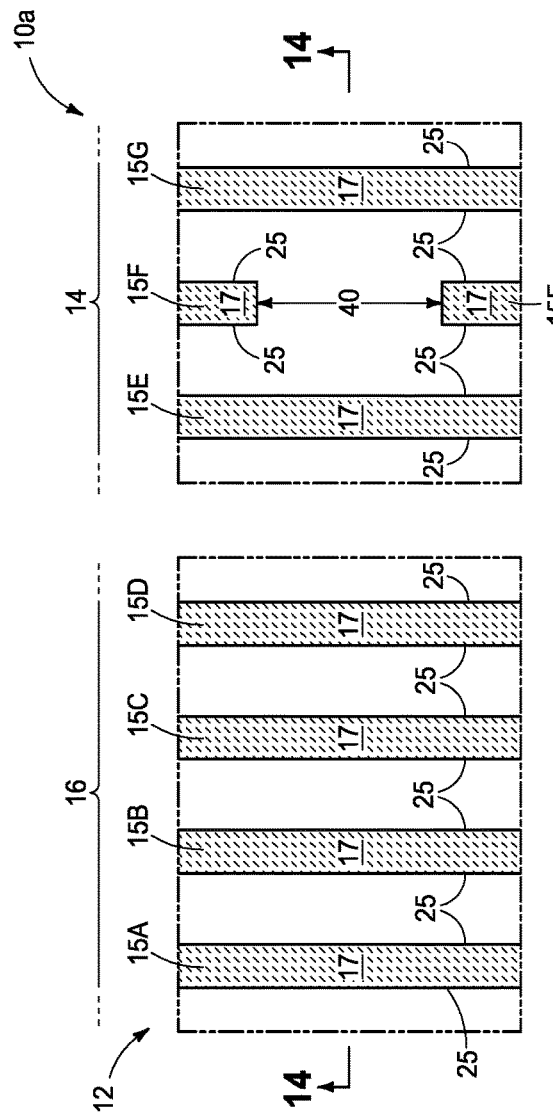
FIG. 13 is a diagrammatic cross-sectional view of a portion of a substrate in process in accordance with an embodiment of the invention and is taken through line 13-13 in FIG. 14.
Figure 14:
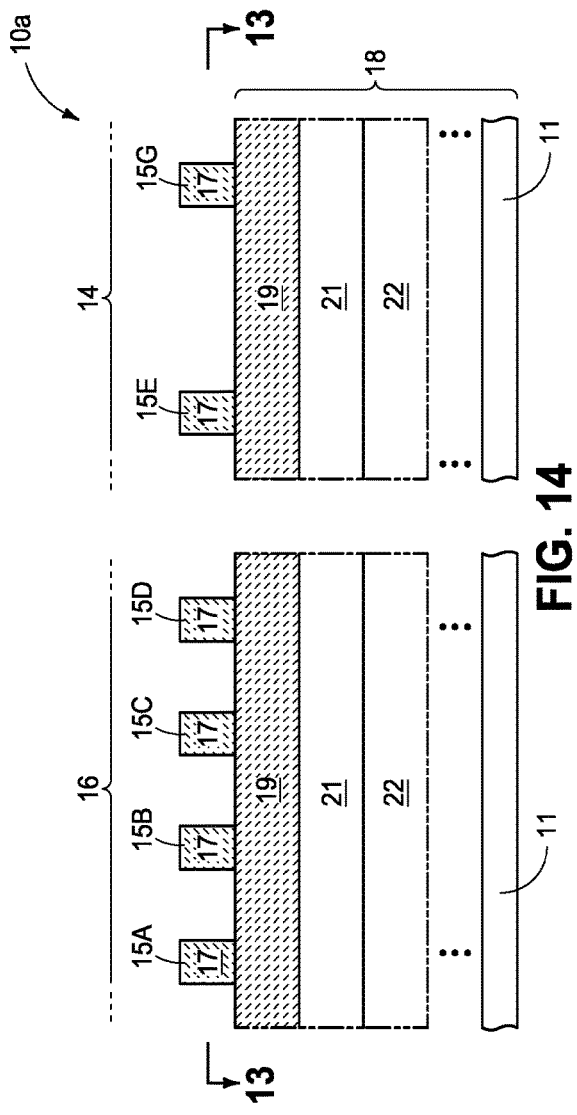
FIG. 14 is a view taken through line 14-14 in FIG. 13.
Figure 15:
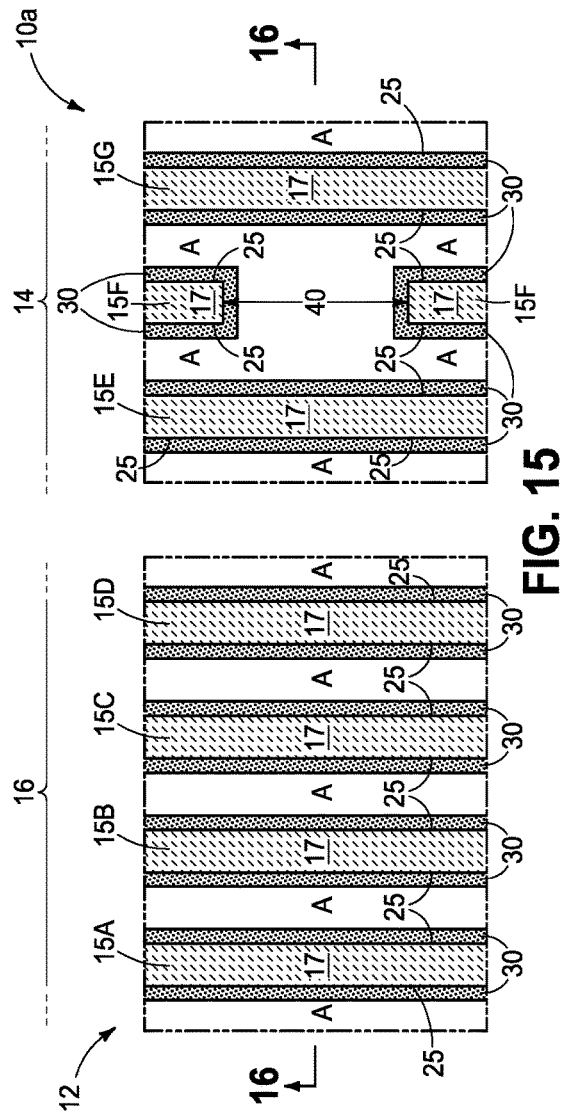
FIG. 15 is a view of the FIG. 13 substrate at a processing step subsequent to that shown by FIG. 13 and is taken through line 15-15 in FIG. 16.
Figure 16:
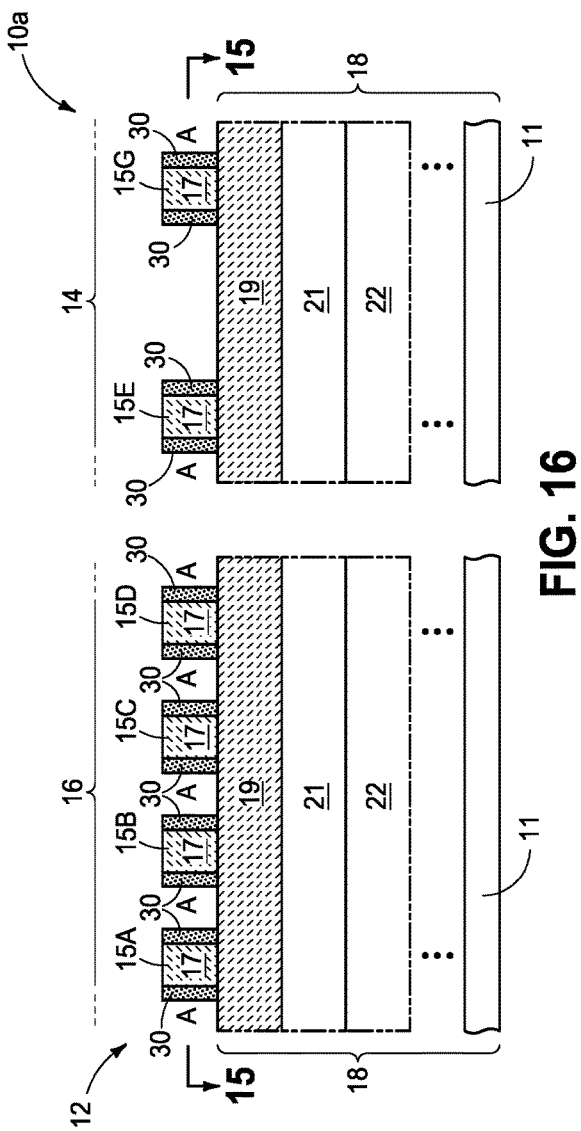
FIG. 16 is a view taken through line 16-16 in FIG. 15.

An alternate example method embodiment in accordance with an aspect of the invention is next described with reference to FIGS. 13-20 with respect to a substrate construction 10a. Like numerals from the above-described embodiments have been used where appropriate, with some construction differences being indicated with the suffix "a" or with different numerals. Referring to FIGS. 13 and 14, longitudinally-elongated and laterally-spaced parallel mask lines 15A-15G (generically referred to as 15*) comprising photoimageable material 17 have been formed over lower substrate material 18. FIGS. 13 and 14 show example processing as may occur subsequent to laterally-trimming of mask lines 15* analogous to that shown and described above with respect to FIGS. 4 and 5. However, substrate construction 10a is not shown as comprising a mask bridge (although it may have one elsewhere), but rather is shown as comprising a longitudinal mask gap 40 that extends completely laterally across one of the mask lines (e.g., mask line 15F).

Figure 17:
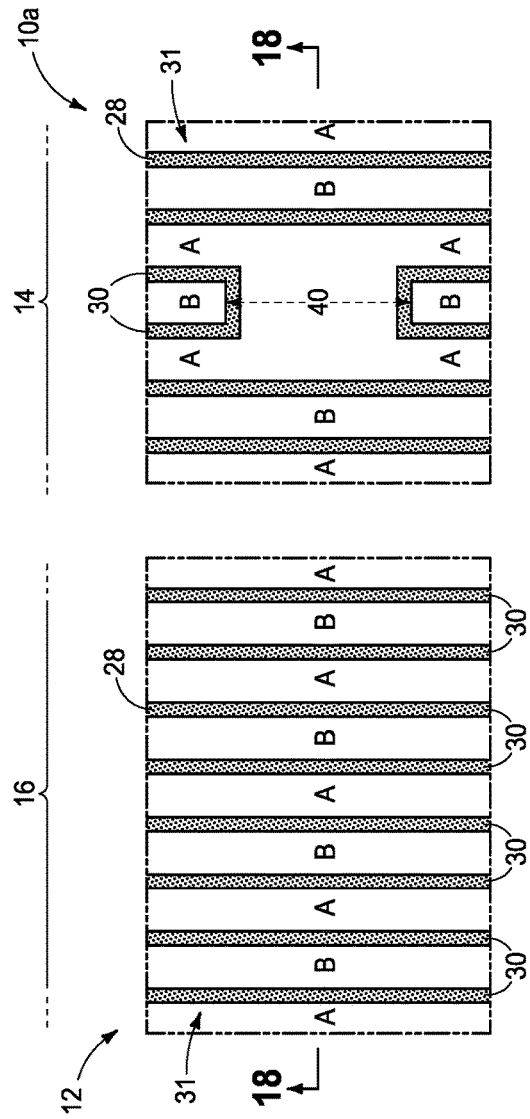
FIG. 17 is a view of the FIG. 15 substrate at a processing step subsequent to that shown by FIG. 15 and is taken through line 17-17 in FIG. 18.
Figure 18:
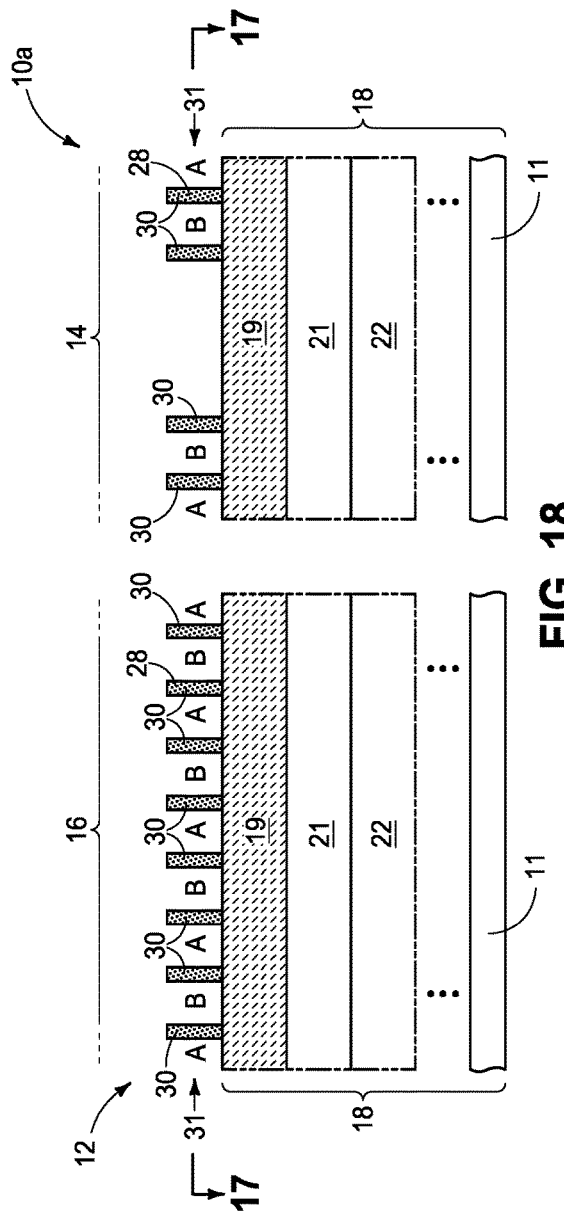
FIG. 18 is a view taken through line 18-18 in FIG. 17.

FIGS. 15-18 show example subsequent processing analogous to that described above with respect to FIGS. 6-10 wherein first spaces A and second spaces B have been formed, yet, however, wherein the A and B spaces end up being been positionally reversed in FIGS. 17 and 18 compared to FIGS. 9 and 10. Regardless, and in one embodiment as shown, the same essential construction may result in FIGS. 17 and 18 as compared to FIGS. 9 and 10.

FIGS. 19 and 20 show subsequent processing analogous to that described above with respect to FIGS. 11 and 12, and which are shown as being of the same essential construction relative one another (e.g., FIGS. 19, 20 resulting at least in part by using a longitudinal mask gap 40 and FIGS. 11, 12 resulting at least in part by using a mask bridge 20).

Regardless, consider that after mask 31 (FIGS. 9, 10 or FIGS. 17, 18) has been removed (FIGS. 11, 12 or FIGS. 19, 20), one may be left questioning (e.g., not know) which of third spaces C resulted from first spaces A and which resulted from second spaces B. For ease of depiction, first spaces A and second spaces B in the figures are shown as being of the same identical lateral dimensions individually. Additionally, the A and B spaces are shown as being the same relative the other (as are the elevationally-projecting features 34* comprising material 19 that are atop material 21 in FIGS. 11, 12, 19, and 20). However, if such is desirable, such may not necessarily occur as such lateral dimensions are dependent in part on the patterning of mask lines 15* (including any lateral trimming thereof) and deposition thickness of material 28 of sidewall masses 30. Variation in one or more of these can result in lateral dimension of spaces A and B being different from one another which may be highly undesirable and heretofore incredibly difficult or impossible to determine what caused what after mask 31 has been removed. However, provision of a longitudinal target gap 35 and/or a lower-substrate-material bridge 36 enables using one or both of such as a reference location (e.g., as a starting location or point) to reckon which of third spaces C in analysis area 16 were derived from first spaces A and/or which of third spaces C were derived from second spaces B. For example, inherently knowing whether a mask bridge 20 or a longitudinal mask gap 40 was initially formed in a reference area 14 enables even after removal of mask 31 which of spaces A or B at the longitudinal target gap or the lower-substrate material bridge were created from a first space A or a from a second space B that may be used as a starting location/point in counting or progressing from reference area 14 towards analysis area 16 enabling determination of which of third spaces C resulted from a first space A and/or from a second space B. With such information, for example, the person-of-skill-in the art may determine cause of different dimensioned spaces/elevationally-projecting features and may modify subsequent processing on the same or different substrate construction.

Regardless, and in one embodiment where a substrate construction 10 as shown in FIG. 1 is fabricated, an embodiment of the invention includes at some point in time (e.g., now or later) cutting through scribe-line area 7 to singulate die areas 5 into individual integrated-circuit die.

Figure 21:
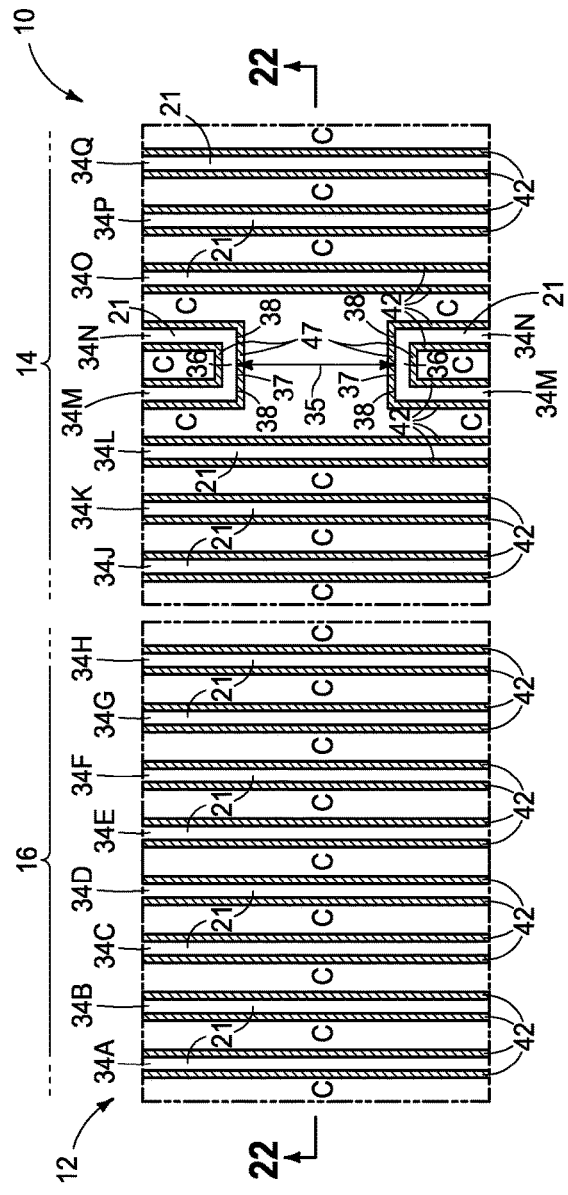
FIG. 21 is a view of the FIG. 11 substrate at a processing step subsequent to that shown by FIG. 11 and is taken through line 21-21 in FIG. 22.
Figure 22:
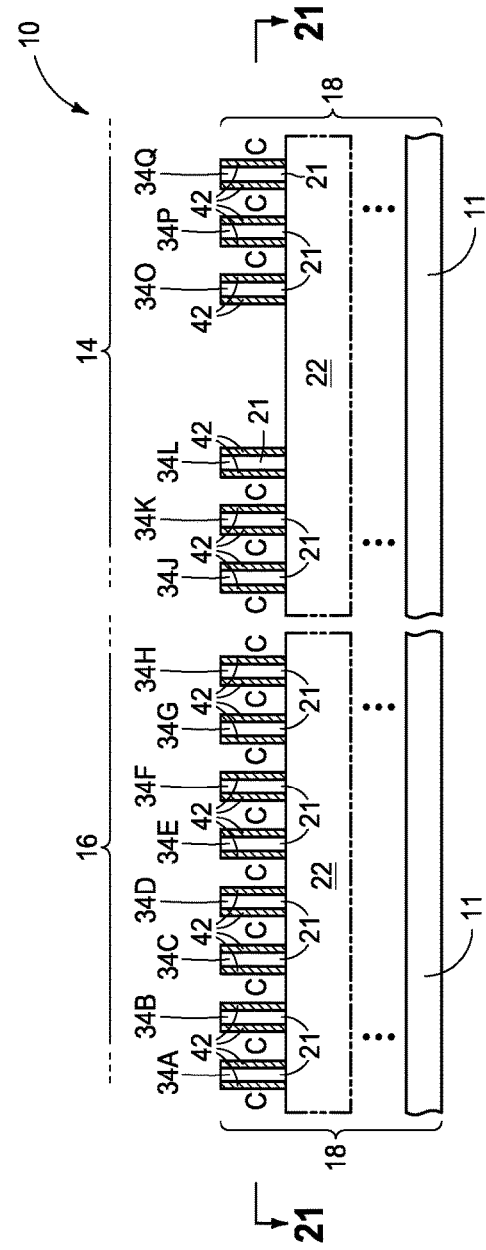
FIG. 22 is a view taken through line 22-22 in FIG. 21.

Referring to FIGS. 21 and 22 show an example processing of substrate construction 10 subsequent to that shown by FIGS. 11 and 12, respectively. In one embodiment and as shown, conductive material 42 (e.g., metal material or conductively-doped semiconductive material) has been formed in longitudinal target gap 35 and along sidewalls of lower-substrate-material bridges 36. In one such embodiment and as shown, the etching as depicted by FIGS. 11 and 12 has been stopped (i.e., terminated), and target lines 34*, longitudinal target gap 35, and lower-substrate-material bridges 36 have subsequently been translated (e.g., by etching) deeper into lower substrate material 18 (e.g., into material 21) prior to forming conductive material 42. Regardless, conductive material 42 may be formed, for example, by deposition of material 42 followed by maskless anisotropic etching thereof to largely remove it from being over horizontal surfaces. In one embodiment, that conductive material 42 that is formed along sidewalls of lower-substrate-material bridges 36 comprises a conductive bridge 47 that is dummy in a finished construction.

Figure 23:
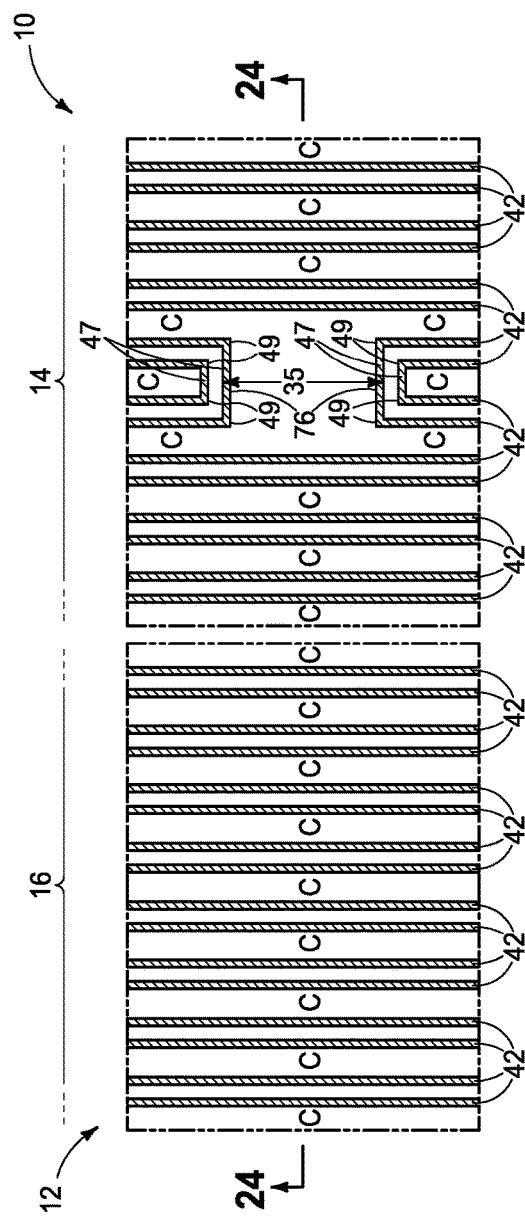
FIG. 23 is a view of the FIG. 21 substrate at a processing step subsequent to that shown by FIG. 21 and is taken through line 23-23 in FIG. 24.
Figure 24:
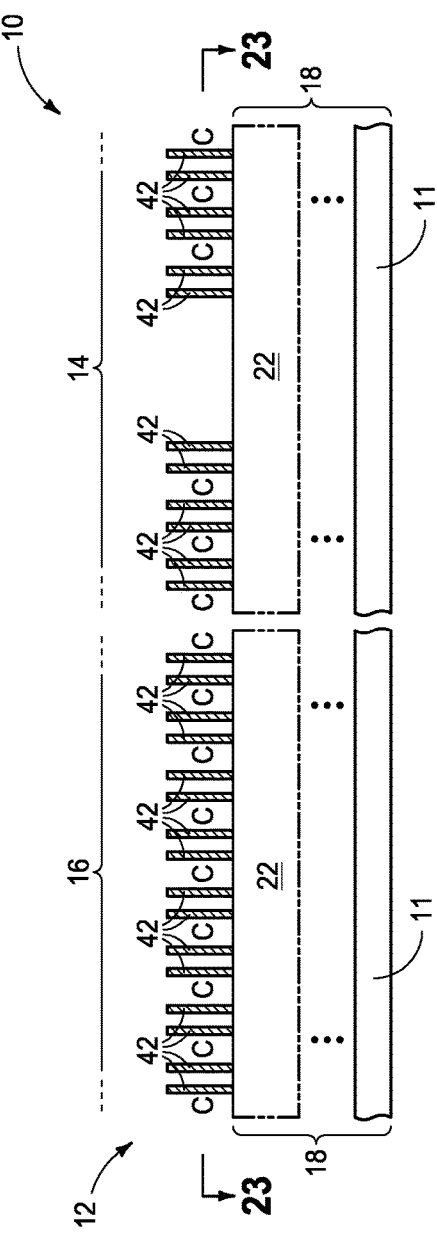
FIG. 24 is a view taken through line 24-24 in FIG. 23.

FIGS. 23 and 24 show example subsequent processing wherein target lines 34* (not shown) have been removed, for example by selective etching thereof relative to materials 42 and 22. Additional or other processing may occur.

Other and/or subsequent processing may occur, for example in an embodiment described with reference to FIGS. 25-33 and 37-40. Referring to FIGS. 25 and 26, subsequent processing is shown as may occur immediately-subsequent to that shown by FIGS. 11, 12 or FIGS. 19, 20 with respect to substrate 10 or 10a which, by of way of example only in the above-described embodiments, are the same essential construction and are therefore referred to as substrate construction 10 in FIGS. 25-33 and 37-40. Longitudinally-elongated and laterally-spaced parallel masking lines 50A-50D (generically referred to as 50*) comprising photoimaging material 51 (e.g., a material capable of being photopatterned such as photoresist, polyimide, or future-developed photoimaging/photoimageable material, and which may be of same or different composition as photo-imageable material 17) have been formed above target lines 34* above a lower sub-material 53 (which may comprise lower substrate material 18). Masking lines 50* angle (i.e., other than by the straight angle) relative to target lines 34*. Masking lines 50* and target lines 34* are shown as being angled 90° relative one another, although other angles may of course be used. Example lower-sub material 53 is shown as comprising an example hardmask or underlayer material 56 (e.g., one or more of carbon, silicon dioxide, silicon nitride, antireflective coating, etc.) that may be sacrificial.

In some embodiments, masking lines 50* comprise (c): a masking bridge comprising the photoimaging material extending laterally between and interconnecting two immediately-laterally-adjacent of the masking line, or (d): a longitudinal masking gap extending completely laterally across one of the masking lines, analogous to (a) (d) as described above. Further, both of the mask lines and the masking lines may comprise a bridge, both may comprise a longitudinal gap, or one may comprise a bridge and the other comprise a longitudinal gap. FIGS. 25 and 26 show an example embodiment comprising (c), specifically having a masking bridge 52 comprising photoimaging material 51 that extends laterally between and interconnects two immediately-laterally-adjacent masking lines 50B, 50C, and within a reference area 75 that may be different from reference area 14. FIGS. 25 and 26 show analogous processing to that shown in or through FIGS. 4 and 5 above wherein masking lines 50* and masking bridge 52 have been laterally trimmed like mask lines 15*. Masking lines 50* and masking bridge 52 may be considered as comprising opposing sidewalls 54 and 55, respectively.

Figure 27:
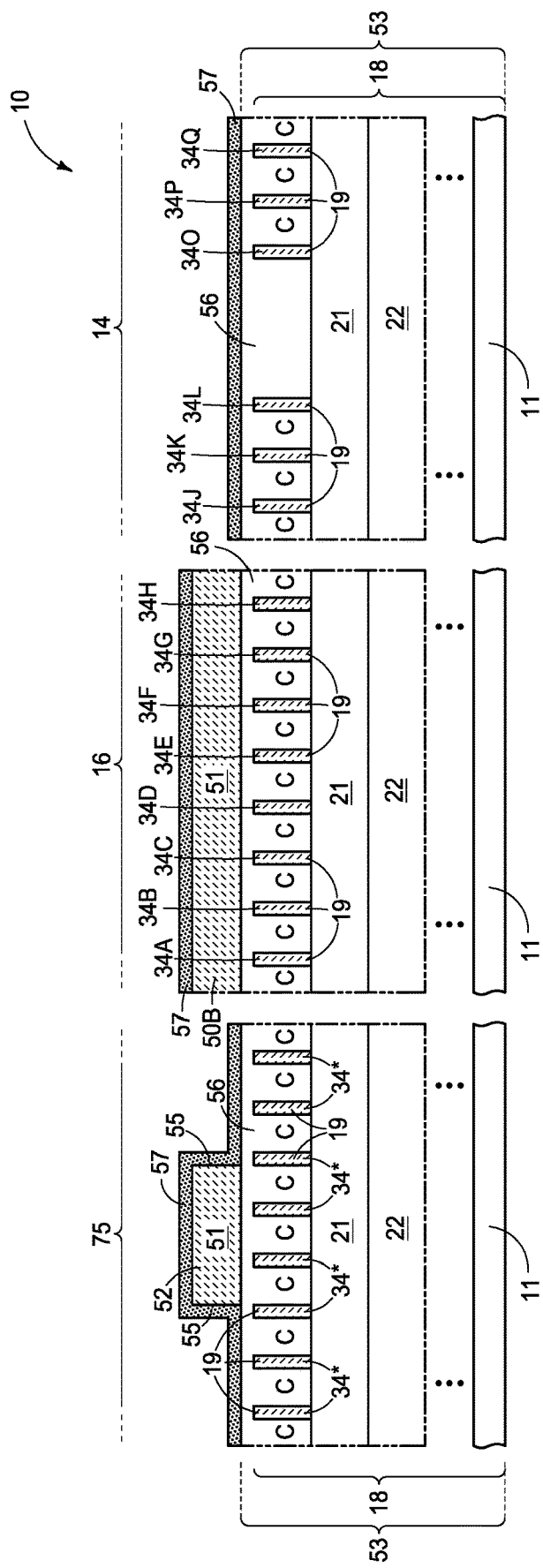
FIG. 27 is a view of the FIG. 26 substrate at a processing step subsequent to that shown by FIG. 26.

Referring to FIG. 27, a material 57 of different composition from that of photoimaging material 51 (e.g., an oxide such as silicon dioxide) has been formed as shown. Such may be considered as a spacer layer or spacer-forming layer, for example as used in what some may consider as pitch multiplication processing.

FIGS. 28 and 29 depict example subsequent processing wherein material 57 has been patterned (e.g., by maskless anisotropic etching of material 28) to largely remove such from being over horizontal surfaces, thereby forming side masses 59 of different composition from that of photoimaging material 51 along opposing sidewalls 54 of individual masking lines 50* and along opposing sidewalls 55 of masking bridge 52 (or along opposing sidewalls of a (d): a longitudinal masking gap, if used). Immediately-adjacent side masses 59 that are laterally between immediately-adjacent individual masking lines 50* may be considered as having fourth spaces D there-between. Fourth spaces D may not necessarily be of the same size relative one another.

Referring to FIGS. 30 and 31, masking lines 50* (not shown) have been removed (e.g., by selective etching and/or ashing of photoimaging material 51 [not shown]) from between side masses 59 to form fifth spaces E between side masses 59 that laterally alternate with fourth spaces D. Use of "fourth" and "fifth" as respects spaces D and E is for convenience in distinguishing one from the other, and either may be formed before or while forming the other. Fifth spaces E may not necessarily be of the same size relative one another. Masking bridge 52 (not shown) has also been removed. Remaining sidewall masses 59 may be considered as collectively comprising a mask 58.

Figure 32:
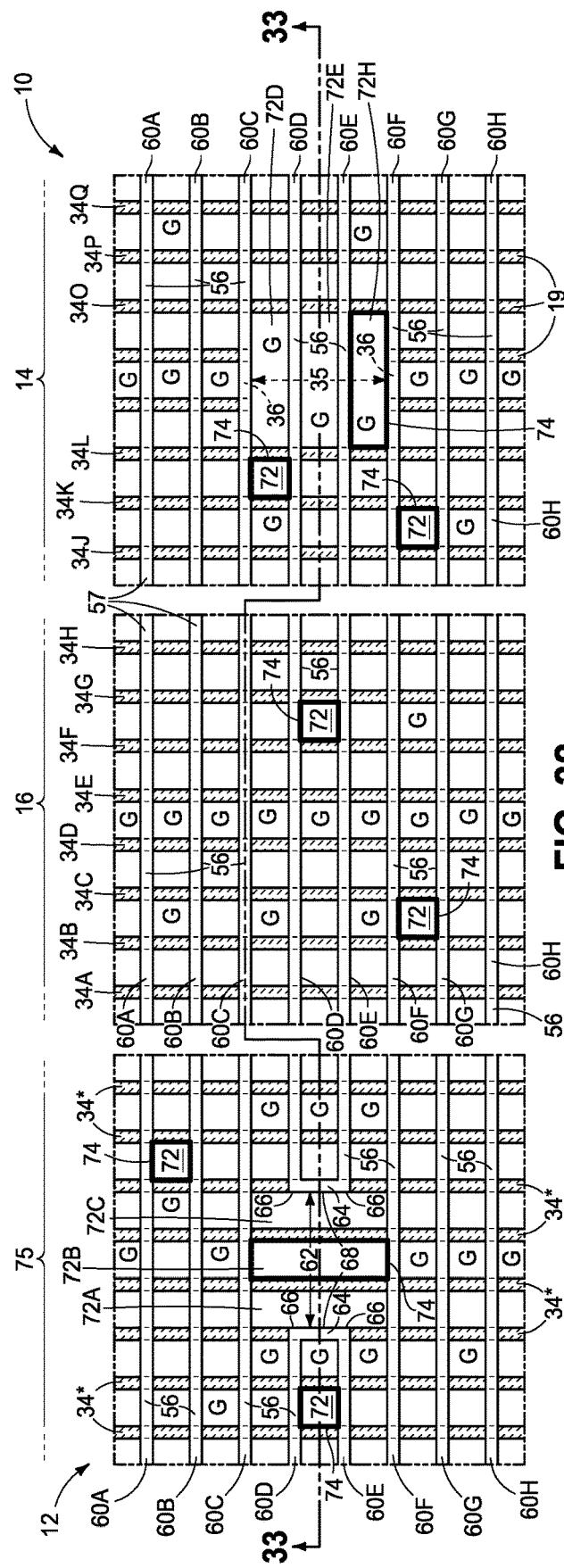
FIG. 32 is a view of the FIG. 30 substrate at a processing step subsequent to that shown by FIG. 30 and is taken through line 32-32 in FIG. 33.
Figure 33:
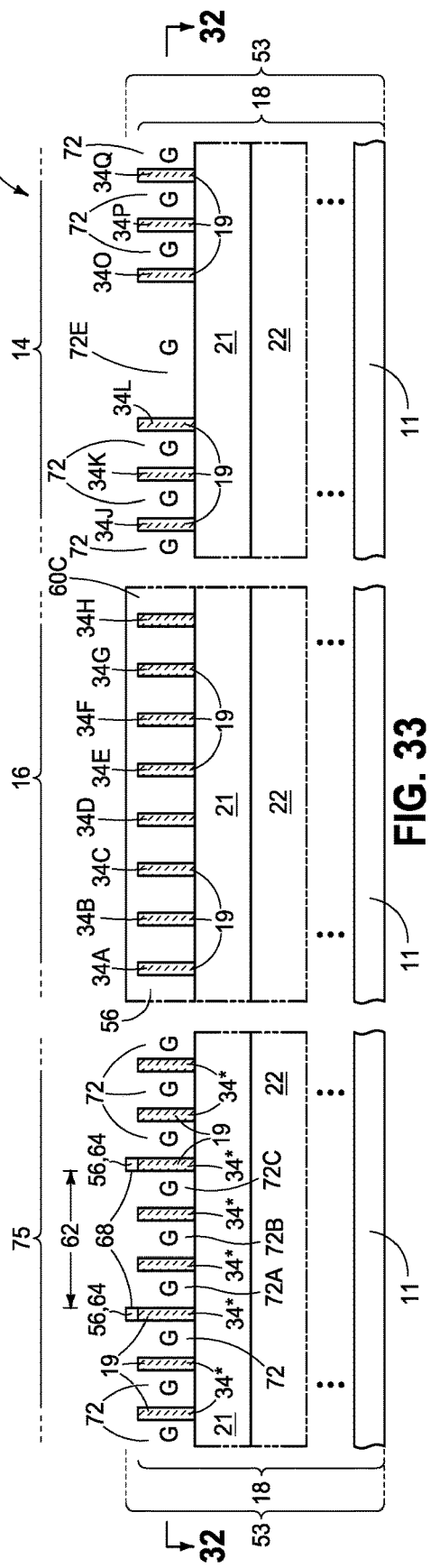
FIG. 33 is a view taken through line 33-33 in FIG. 32.

Referring to FIGS. 32 and 33, mask 58 (not shown) comprising side masses 59 (not shown) has been used while etching into lower sub-material 53 to form longitudinally-elongated and parallel targeting lines 60A-G (generically referred to as 60*) having sixth spaces G laterally there-between. Two immediately-laterally-adjacent targeting lines (e.g., 60D, 60E) have a longitudinal targeting gap 62 extending completely laterally across and completely laterally between said individual two immediately-laterally-adjacent targeting lines 60D, 60E at least in part as a result of the (c) or (d). An interconnecting bridge 64 extends laterally between and interconnects longitudinal ends 66 of said two immediately-laterally-adjacent targeting lines 60D, 60E at opposite longitudinal ends 68 of longitudinal targeting gap 62.

In one embodiment and as shown, targeting lines 60* are in an analysis area (e.g., 16), with such analysis area being spaced away from longitudinal targeting gap 62 and interconnecting bridges 64 (e.g., that are in reference area 75). In one embodiment and as shown in FIGS. 32 and 33, mask 58 (not shown) has been removed, and longitudinal targeting gap 62 or one of interconnecting bridges 64 is used as a reference location to reckon which of sixth spaces G in the analysis area were derived from fourth spaces D or which of sixth spaces G were derived from the fifth spaces E. In one embodiment and as shown, etching into lower sub-material 53 using side masses 59 as a mask 58 forms at least one of the targeting lines (e.g., 60D and/or 60E), and in one embodiment multiple of the targeting lines (e.g., 60D and 60E), in and laterally crossing longitudinal target gap 35 (e.g., in reference area 14).

In one embodiment and as shown, using side masses 59 as a mask 58 while etching lower sub-material 53 forms openings 72, 72A, 72B, 72C, 72D, 72E, and 72H (generically referred to as 72*) in lower substrate material 18 that individually have an encircling horizontal perimeter 74 of lower substrate material 18 (only a few being shown in bold-line with a numeral 74 and an associated lead line for drawing clarity). Collectively, openings 72* may have multiple different sizes and/or shapes. In one embodiment and as shown, openings 72A, 72B, 72C, 72D, 72E, and 72H individually have a respective maximum straight-line-horizontal extent (e.g., a corner-to-corner diagonal in individual openings 72A, 72B, 72C, 72D, 72E, and 72H in FIG. 32) that is greater than a maximum straight-line-horizontal extent of individual openings 72 (e.g., a corner-to-corner diagonal in individual openings 72 in FIG. 32).

Figure 34:
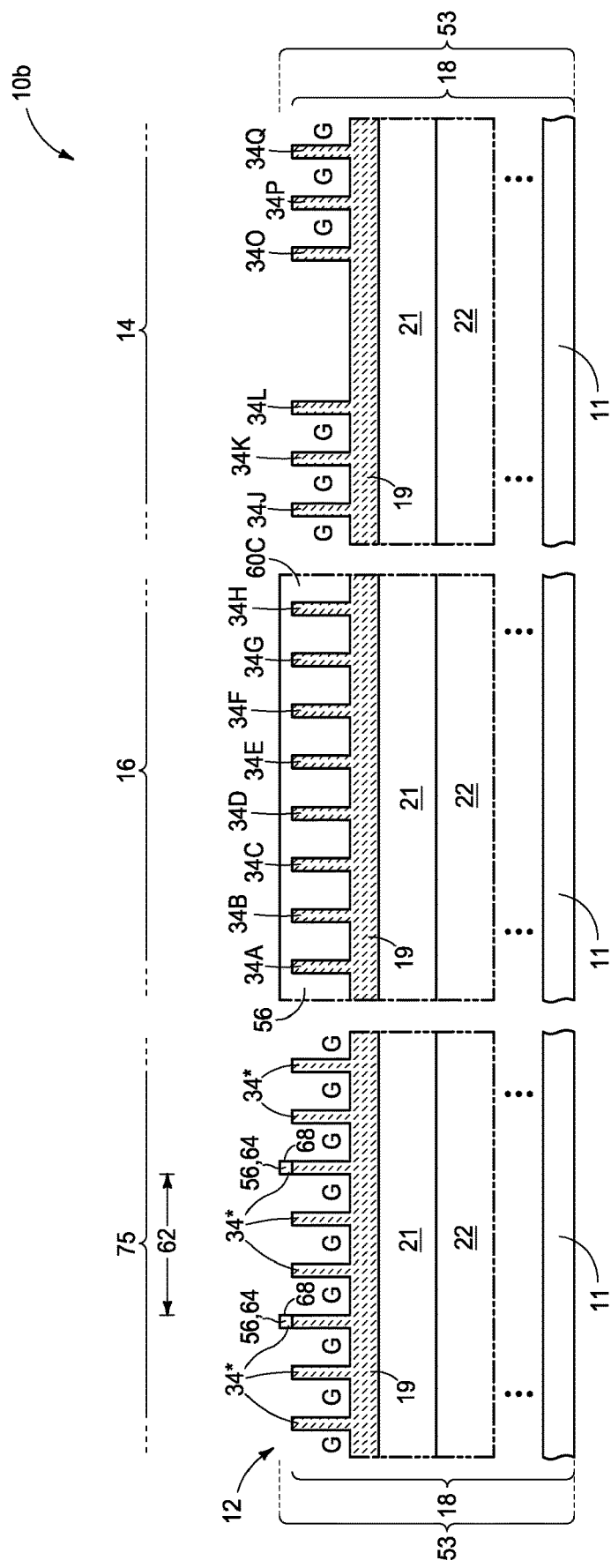
FIG. 34 is a diagrammatic cross-sectional view of a portion of a substrate in process in accordance with an embodiment of the invention.
Figure 39B:
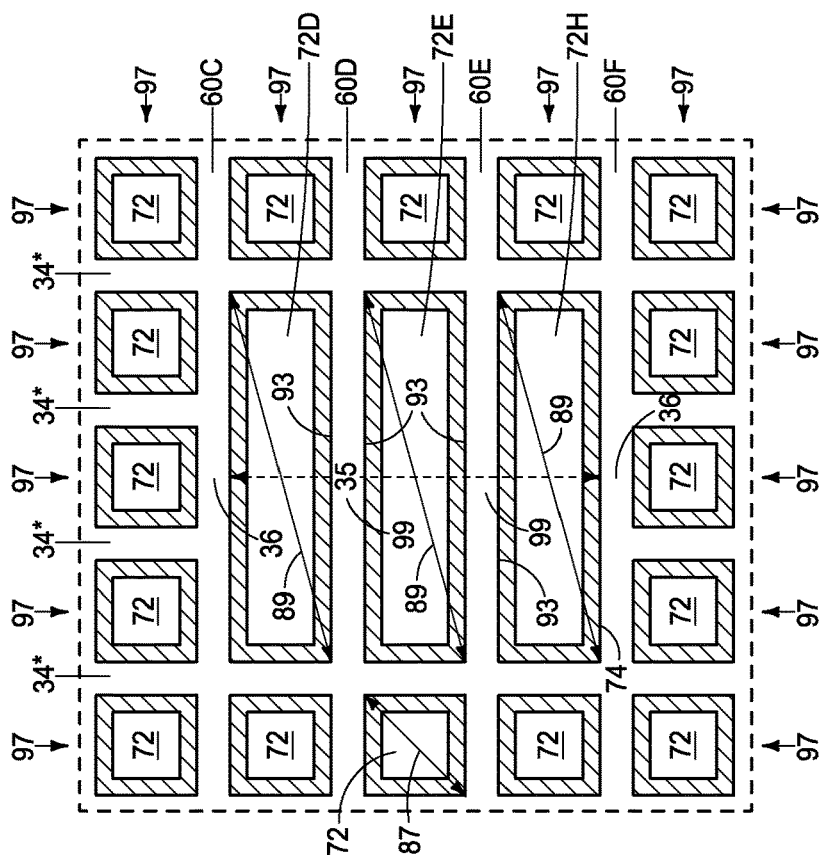
FIGS. 39A and 39B are enlarged portions of FIG. 39 as outlined in FIG. 39.
Figure 39A:
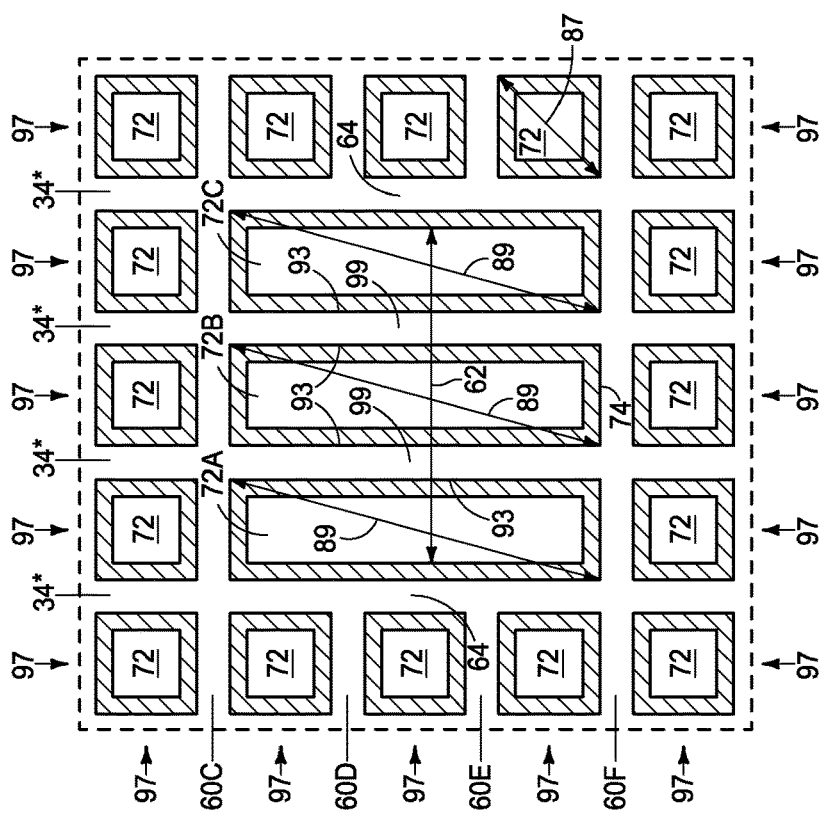

In one such embodiment, such etching may be conducted into target lines 34* (not shown in FIGS. 32, 33) and in one embodiment with targeting lines 60* comprising example material 19, for example as is shown and described with reference to FIGS. 34-36 with respect to a substrate construction 10b. Like numerals from the above-described embodiments have been used where appropriate, with some construction differences being indicated with the suffix "b" or with different numerals. Referring to FIG. 34, an alternate construction 10b is shown in comparison to that of FIG. 33. By way of example only, material 19 is shown as having been formed to be thicker than in the first-described embodiments and the forming of target lines 34* therefrom has not been conducted by completely etching through material 19.

Referring to FIGS. 35 and 36, processing largely analogous to that shown by FIGS. 32 and 33 has been conducted. Targeting lines 60* comprise lowest portions of material 19, with target lines 34* comprising the same material 19 and projecting elevationally (e.g., vertically) relative to targeting lines 60*.

Any other attribute(s) or aspect(s) as shown and/or described herein with respect to other embodiments may be used.

FIGS. 37 and 38 show example subsequent processing. Specifically, the patterns of either FIGS. 32, 33 or FIGS. 35, 36 have been translated (e.g., by etching) deeper into lower substrate material 18 into material 22, and material 19 (not shown) and material 21 (not shown) have been removed.

Subsequent processing as described above, or otherwise, may occur. For example, and referring to FIGS. 39, 39A, 39B, and 40, conductive material 42 has been formed (e): in longitudinal target gap 35; (f): along opposing sidewalls of lower-substrate-material bridges 36; (g): in longitudinal targeting gap 62; (h): along opposing sidewalls of interconnecting bridges 64; and (j): in openings 72*. Conductive material 42 in (e), (f), (g), and (h) may be formed to be dummy in a finished construction. In one such embodiment, all of conductive material 42 in all of (e), (f), (g), and (h) is obliterated (e.g., by etching or sawing-through if in the scribe-line area). All of conductive material 42 in all of (j) is not obliterated (i.e., at least some of such remains in at least some openings 72*) and may be used at least as part of a conductive operative circuitry component, for example as a capacitor electrode. Conductive material 42 is shown as lining and less-than-filling openings 72*. Alternately, as an example only, such may completely fill openings 72* (not shown).

Any other attribute(s) or aspect(s) as shown and/or described herein with respect to other embodiments may be used.

An embodiment of the invention encompasses a method of forming an array (e.g., 12). Such comprises using two different composition masking materials (e.g., 17, 28) in forming a pattern of spaced repeating first features (e.g., 30) of substantially same size and substantially same shape relative one another. A pattern-interrupting second feature of at least one of different size or different shape compared to that of the first features (e.g., any one or combination of a longitudinal gap 29 and a bridge 33 in FIG. 9) is within and interrupts the pattern of first features. The pattern of the first features with the pattern-interrupting second feature is translated (e.g., by etching) into lower substrate material (e.g., 18 in FIGS. 11 and 12) that is below the first features and the pattern-interrupting second feature.

Material of the first features and material of the pattern-interrupting second feature that is above the lower substrate material is removed (e.g., by etching) at least one of during or after the translating. In one embodiment, the translating comprises etching into the lower substrate material. After such removing, the pattern-interrupting second feature in the lower substrate material (e.g., any one or combination of longitudinal gap 35 and a bridge 36 in FIG. 11) is used as a reference location to reckon which of the two different composition masking materials was used to make first spaces (e.g., one of A or B) between the first features in an analysis area in the material that was above the lower substrate material or which of the two different composition masking materials was used to make second spaces between the first features in the analysis area that alternate with the first spaces (e.g., the other of A or B).

In one embodiment, one of the two different compositions comprises a photoresist, and in one such embodiment the other of the two different compositions is devoid of any photoresist. In one embodiment, one of the two different compositions is deposited atop the other, and the method further comprises maskless anisotropically etching the one from being atop the other. In one embodiment, the first features comprise longitudinally-elongated and parallel lines. In one such embodiment, two immediately-laterally-adjacent of the lines have a longitudinal gap extending completely laterally across individual of and completely laterally between said two immediately-laterally-adjacent lines, and the pattern-interrupting second feature comprises the longitudinal gap. In one embodiment, a lower-substrate-material bridge extends laterally between and interconnects longitudinal ends of said two immediately-laterally-adjacent lines at opposite longitudinal ends of the longitudinal gap, with the pattern-interrupting second feature comprising the lower-substrate-material bridge.

In one embodiment, the first features in the lower substrate material comprise openings therein that individually have an encircling horizontal perimeter of the lower substrate material. In one such embodiment, the pattern-interrupting second feature comprises an opening in the lower substrate material that has a maximum straight-line-horizontal extent that is greater than a maximum straight-line-horizontal extent of individual openings of the first features. Any other attribute(s) or aspect(s) as shown and/or described herein with respect to other embodiments may be used.

Embodiments of the invention comprise an integrated circuit and comprise a construction of integrated circuitry independent of method of manufacture. Nevertheless, such may include any of the attributes described above with respect to method embodiments.

In one embodiment, an integrated circuit comprises an array (e.g., 12) of circuit-operative features (e.g., 34* in area 16). Such a circuit also comprises at least one circuit-inoperable conductive construction comprising two laterally-spaced and parallel longitudinally-elongated conductive lines (e.g., 42 formed longitudinally along 34M, 34N). A longitudinal gap (e.g., 35) extends completely laterally across and completely laterally between said two laterally-spaced conductive lines. A conductive bridge (e.g., 47, and that may be dummy in a finished construction) extends laterally between and interconnects longitudinal ends (e.g., 49 in FIG. 23) of said two laterally-spaced conductive lines at opposite longitudinal ends (e.g., 76 in FIG. 23) of the longitudinal target gap. Any other attribute(s) or aspect(s) as shown and/or described herein with respect to other embodiments may be used.

In one embodiment, a construction of integrated circuitry comprises an array (e.g., 12) of substantially same size and substantially same shape first features comprising conductive material (e.g., 42 in openings 72 as first features in FIGS. 39, 39A, 39B, and 40) and being horizontally spaced (i.e., in 3-dimensional space) from one another in horizontal rows (i.e., in 3 dimensional space; e.g., horizontal or vertical 97's shown in 2-dimensional space in FIGS. 39, 39A, 40, and 40B) and individually comprising an encircling horizontal perimeter (e.g., 74) of the conductive material. A second feature (e.g., 42 in any of openings 72A, 72B, 72C, 72D, 72E, and 72H) is among the array of first features and comprises a bridge (e.g., 99 in FIGS. 39, 39A, 39B, and 40) of non-conductive material (e.g., 22 comprising silicon dioxide and/or silicon nitride) extending completely between two immediately-adjacent of the horizontal rows (e.g., orthogonally thereto as shown). Conductive material (e.g., 42, and that may be dummy in a finished circuitry construction) is all along opposing longitudinal sides (e.g., 93 in FIGS. 39A and 39B) of the bridge. The conductive material on each of opposing longitudinal sides of the bridge has a maximum straight-line horizontal extent (e.g., diagonal 89 as conductive material 42 is across all of the base of individual openings 72A, 72B, 72C, 72D, 72E, and 72H) that is greater than a maximum straight-line horizontal extent (e.g., diagonal 87 as conductive material 42 is across all of the base of individual openings 72) of the conductive material of individual of the first features. Any other attribute(s) or aspect(s) as shown and/or described herein with respect to other embodiments may be used.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", extend(ing) horizontally, and horizontally-extending with respect to a field effect transistor are with reference to orientation of the transistor's channel length along which current flows in operation between the source/drain regions. For bipolar junction transistors, "extend(ing) elevationally" "elevationally extending", extend(ing) horizontally, and horizontally-extending, are with reference to orientation of the base length along which current flows in operation between the emitter and collector.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

Herein, "selective" as to etch, etching, removing, removal, forming, and/or formation is such an act of one stated material relative to another stated material(s) so acted upon at a rate of at least 2:1 by volume.

Unless otherwise indicated, use of "or" herein encompasses either and both.

Herein, "dummy" means no current flow there-through in a finished circuitry construction and which may be a circuit inoperable dead end that is not part of a current flow path of a circuit even if extending to or from an electronic component.

CONCLUSION

In some embodiments, a method of forming an array comprises using two different composition masking materials in forming a pattern of spaced repeating first features of substantially same size and substantially same shape relative one another. A pattern-interrupting second feature of at least one of different size or different shape compared to that of the first features is within and interrupts the pattern of first features. The pattern of the first features with the pattern-interrupting second feature are translated into lower substrate material that is below the first features and the pattern-interrupting second feature. Material of the first features and of the pattern-interrupting second feature that is above the lower substrate material is removed at least one of during or after the translating. After the removing, the pattern-interrupting second feature in the lower substrate material is used as a reference location to reckon which of the two different composition masking materials was used to make first spaces between the first features in an analysis area in the material that was above the lower substrate material or which of the two different composition masking materials was used to make second spaces between the first features in the analysis area that alternate with the first spaces.

In some embodiments, a method of forming an array comprising a pattern comprises forming longitudinally-elongated and laterally-spaced parallel mask lines comprising photoimageable material. The mask lines comprise (a): a mask bridge comprising the photoimageable material extending laterally between and interconnecting two immediately-laterally-adjacent of the mask lines, or (b): a longitudinal mask gap extending completely laterally across one of the mask lines. Sidewall masses of different composition from that of the photoimageable material are formed along opposing sidewalls of individual of the mask lines and along opposing sidewalls of the (a) or (b). Immediately-adjacent of the sidewall masses that are laterally between immediately-adjacent of the individual mask lines have first spaces there-between. The mask lines are removed from between the sidewall masses to form second spaces between the sidewall masses that laterally alternate with the first spaces. After removing the mask lines, the sidewall masses are used as a mask while etching into lower substrate material that is below the sidewall masses to form longitudinally-elongated and parallel target lines having third spaces laterally there-between, two immediately-laterally-adjacent of the target lines having a longitudinal target gap extending completely laterally across individual of and completely laterally between said two immediately-laterally-adjacent target lines at least in part as a result of the (a) or (b), a lower-substrate-material bridge extending laterally between and interconnecting longitudinal ends of said two immediately-laterally-adjacent target lines at opposite longitudinal ends of the longitudinal target gap.

In some embodiments, an integrated circuit comprises an array of circuit-operative features and at least one circuit-inoperative conductive construction, the latter comprising two laterally-spaced and parallel longitudinally-elongated conductive lines. A longitudinal gap extends completely laterally across and completely laterally between said two laterally-spaced conductive lines. A conductive bridge extends laterally between and interconnects longitudinal ends of said two laterally-spaced conductive lines at opposite longitudinal ends of the longitudinal target gap.

In some embodiments, a construction of integrated circuitry comprises an array of substantially same size and substantially same shape first features comprising conductive material and being horizontally spaced from one another in horizontal rows and individually comprising an encircling horizontal perimeter of the conductive material. A second feature is among the array of first features. The second feature comprises a bridge of non-conductive material extending completely between and across two immediately-adjacent of the horizontal rows. Conductor material is all along opposing longitudinal sides of the bridge. The conductor material on each of the opposing longitudinal sides of the bridge has a maximum straight-line-horizontal extent that is greater than a maximum straight-line horizontal extent of the conductive material of individual of the first features.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A construction of integrated circuitry, comprising:
   an array comprising:
      a non-conductive material over an upper surface of a base;

a plurality of substantially same size and substantially same shape first features, the first features comprising vertically extending cores of the non-conductive material horizontally surrounded by a conductive material, the first features being horizontally spaced from one another in horizontal rows that extend along a first horizontal direction, vertically extending outer surfaces of the first feature consisting of the conductive material; and a second feature extending lengthwise along a second horizontal direction, the second feature comprising:
  a bridge of the non-conductive material extending in the second horizontal direction completely across two immediately-adjacent of the horizontal rows, the bridge having opposing longitudinal sides extending along the second horizontal direction; and
  the conductive material along an entirety of opposing longitudinal sides of the bridge, the conductive material on each of the opposing longitudinal sides of the bridge having a maximum straight-line-horizontal extent that is greater than a maximum straight-line horizontal extent of the conductive material of individual of the first features.

2. The construction of claim 1 wherein the bridge of non-conductive material extends completely between and across three immediately-consecutive of the horizontal rows.

3. The construction of claim 1 comprising multiple of said second features.

4. A semiconductor array comprising:
an analysis area of a substrate;
a reference area of the substrate; and
a series of conductive lines extending along a first direction over the substrate in the analysis area and the reference area, the series of conductive lines comprising individual lines of conductive material spaced from adjacent lines along a second direction;
wherein the series of conductive lines comprises, in consecutive order along the second direction, a first conductive line, a second conductive line, a third conductive line, a fourth conductive line, a fifth conductive line and a sixth conductive line, each of the second, third, fourth and fifth conductive lines being discontinuous along the first direction; and
the first and sixth conductive lines being non-discontinuous along the first direction.

5. The semiconductor array of claim 4 further comprising a first segment of the conductive material extending between the second conductive line and the fifth conductive line along the second direction, and a second segment of the conductive material extending between the second conductive line and the fifth conductive line along the second direction, the first segment being spaced from the second segment along the first direction by a gap.

6. The semiconductor array of claim 5 wherein the second conductive first line and the fifth conductive line are absent across the gap.

7. The semiconductor array of claim 6 further comprising a third segment of the conductive material extending between the third conductive line and the fourth conductive line along the second direction, and a fourth segment of the conductive material extending between the third conductive line and the fourth conductive line along the second direction, the third segment being spaced from the fourth segment by a distance along the first direction.

8. The array of claim 7 wherein the third conductive line and the fourth conductive line are absent across the distance between the third and fourth segments.

9. The array of claim 7 wherein the distance between the third and fourth segments is greater than a distance of the gap between the first segment and the second segment.

* * * * *